(12) United States Patent
Matsukura

(10) Patent No.: US 8,525,407 B2
(45) Date of Patent: Sep. 3, 2013

(54) LIGHT SOURCE AND DEVICE HAVING THE SAME

(75) Inventor: Hideki Matsukura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/819,736

(22) Filed: Jun. 21, 2010

(65) Prior Publication Data

US 2010/0328928 A1  Dec. 30, 2010

(30) Foreign Application Priority Data

Jun. 24, 2009  (JP) ................ 2009-149726

(51) Int. Cl.
*H01L 51/50* (2006.01)

(52) U.S. Cl.
USPC ........................................... 313/512

(58) Field of Classification Search
USPC ............................................. 313/504, 512
See application file for complete search history.

(56) References Cited

U.S. PATENT DOCUMENTS

| | | | |
|---|---|---|---|
| 5,881,024 A | 3/1999 | Nishimura et al. | |
| 6,873,099 B2 | 3/2005 | Maeda | |
| 7,045,822 B2 | 5/2006 | Tsuchiya | |
| 7,181,179 B2 | 2/2007 | Fujisawa et al. | |
| 7,226,332 B2 | 6/2007 | Arai et al. | |
| 7,239,081 B2 | 7/2007 | Tsutsui | |
| 7,301,511 B2 | 11/2007 | Maeda | |
| 7,420,203 B2 | 9/2008 | Tsutsui et al. | |
| 7,473,923 B2 | 1/2009 | Tsutsui et al. | |
| 7,488,985 B2 | 2/2009 | Tsuchiya | |
| 7,535,440 B2 | 5/2009 | Nishi et al. | |
| 7,928,353 B2 | 4/2011 | Fujimoto et al. | |
| 8,120,257 B2 | 2/2012 | Takamura | |
| 2003/0127967 A1 | 7/2003 | Tsutsui et al. | |
| 2004/0096697 A1* | 5/2004 | Tai et al. | 428/690 |
| 2006/0066227 A1* | 3/2006 | Virnich et al. | 313/505 |
| 2006/0197081 A1* | 9/2006 | Tsuchiya | 257/40 |
| 2007/0007516 A1 | 1/2007 | Seo et al. | |
| 2007/0243786 A1 | 10/2007 | Tsutsui | |
| 2007/0257607 A1 | 11/2007 | Arai et al. | |

(Continued)

FOREIGN PATENT DOCUMENTS

| | | |
|---|---|---|
| EP | 2 204 674 A1 | 7/2010 |
| EP | 2 270 069 A1 | 1/2011 |

(Continued)

OTHER PUBLICATIONS

J. Kido et al. 'Multilayer White Light-Emitting Organic Electroluminescent Device'; Science, vol. 267, No. 5202; pp. 1332-1334; Mar. 3, 1995.

(Continued)

*Primary Examiner* — Anh Mai
*Assistant Examiner* — Hana Featherly
(74) *Attorney, Agent, or Firm* — Fish & Richardson P.C.

(57) ABSTRACT

Deterioration of the whole electroluminescence layer which is caused by moisture penetration through the electroluminescence layer because of a pinhole in an electrode is prevented. A plurality of island-shaped electroluminescence layers are provided. That is, an electroluminescence layer is divided into plural layers. In addition, the plurality of island-shaped electroluminescence layers are interposed between a pair of common electrodes. Accordingly, even when moisture penetrates into one of the island-shaped electroluminescence layers, moisture does not penetrate into another of the island-shaped electroluminescence layers.

24 Claims, 33 Drawing Sheets

(56) References Cited

U.S. PATENT DOCUMENTS

| | | |
|---|---|---|
| 2008/0029765 A1* | 2/2008 | Yamazaki et al. ............ 257/67 |
| 2009/0045738 A1 | 2/2009 | Tsutsui et al. |
| 2009/0115318 A1 | 5/2009 | Gregory et al. |
| 2009/0165854 A1 | 7/2009 | Yamazaki et al. |
| 2009/0195155 A1 | 8/2009 | Tsuchiya |
| 2010/0195231 A1 | 8/2010 | Suzuki et al. |
| 2011/0013379 A1 | 1/2011 | Matsukura |
| 2011/0042661 A1 | 2/2011 | Endo et al. |
| 2011/0108814 A1 | 5/2011 | Iida et al. |
| 2013/0020562 A1 | 1/2013 | Iida et al. |

FOREIGN PATENT DOCUMENTS

| | | |
|---|---|---|
| EP | 2 272 894 A1 | 1/2011 |
| JP | 08-327752 A | 12/1996 |
| JP | 09-113656 A | 5/1997 |
| JP | 09-166673 A | 6/1997 |
| JP | 10-213459 A | 8/1998 |
| JP | 10-300527 A | 11/1998 |
| JP | 11-174164 A | 7/1999 |
| JP | 2000-009821 A | 1/2000 |
| JP | 2000-029410 A | 1/2000 |
| JP | 2000-137453 A | 5/2000 |
| JP | 2000-262369 A | 9/2000 |
| JP | 2002-074306 A | 3/2002 |
| JP | 2002-148361 A | 5/2002 |
| JP | 2002-329418 A | 11/2002 |
| JP | 2002-359068 A | 12/2002 |
| JP | 2002-359069 A | 12/2002 |
| JP | 2003-059651 A | 2/2003 |
| JP | 2003-217868 A | 7/2003 |
| JP | 2004-095541 A | 3/2004 |
| JP | 2004-127923 A | 4/2004 |
| JP | 2004-134282 A | 4/2004 |
| JP | 2004-234868 A | 8/2004 |
| JP | 2005-093190 A | 4/2005 |
| JP | 2005-332690 A | 12/2005 |
| JP | 2006-054197 A | 2/2006 |
| JP | 2006-236744 A | 9/2006 |
| JP | 2007-115629 A | 5/2007 |
| JP | 2007-137234 A | 6/2007 |
| JP | 2007-172918 A | 7/2007 |
| JP | 2007-172919 A | 7/2007 |
| JP | 2007-173088 A | 7/2007 |
| JP | 2007-173424 A | 7/2007 |
| JP | 2007-173519 A | 7/2007 |
| JP | 2007-173520 A | 7/2007 |
| JP | 2007-173525 A | 7/2007 |
| JP | 2007-173564 A | 7/2007 |
| JP | 2007-220393 A | 8/2007 |
| JP | 2007-227523 A | 9/2007 |
| JP | 2007-273397 A | 10/2007 |
| JP | 2007-294137 A | 11/2007 |
| JP | 2007-294519 A | 11/2007 |
| JP | 2008-117742 A | 5/2008 |
| JP | 2008-123738 A | 5/2008 |
| JP | 2008210676 A | 9/2008 |
| JP | 2008210678 A | 9/2008 |
| JP | 2008-279227 A | 11/2008 |
| JP | 2008-310631 A | 12/2008 |
| JP | 2009-038019 A | 2/2009 |
| JP | 2009-048814 A | 3/2009 |
| JP | 2009-098650 A | 5/2009 |
| JP | 2009-105033 A | 5/2009 |
| JP | 2009-129766 A | 6/2009 |
| JP | 2009-141339 A | 6/2009 |
| JP | 2009-158103 A | 7/2009 |
| JP | 2009-164022 A | 7/2009 |
| JP | 2009-212510 A | 9/2009 |
| JP | 2009-227663 A | 10/2009 |
| JP | 2009-230960 A | 10/2009 |
| JP | 2009-231278 A | 10/2009 |
| JP | 2009-263665 A | 11/2009 |
| JP | 2009-266814 A | 11/2009 |
| JP | 2009-272280 A | 11/2009 |
| JP | 2009-278076 A | 11/2009 |
| JP | 2009-278077 A | 11/2009 |
| JP | 2009-287000 A | 12/2009 |
| JP | 2009-289742 A | 12/2009 |
| JP | 2009-295486 A | 12/2009 |
| JP | 2009-295487 A | 12/2009 |
| JP | 2009-295974 A | 12/2009 |
| WO | 2001/092970 A1 | 12/2001 |
| WO | 2007/023272 A1 | 3/2007 |

OTHER PUBLICATIONS

Information Offer Form, Japanese Application No. 2012-209103, dated Jan. 11, 2013, 4 pages with English translation.

Notification, Japanese Application No. 2012-209103, dated Feb. 4, 2013, 1 page with English translation.

\* cited by examiner

PRIOR ART

LIGHT SOURCE AND DEVICE HAVING THE SAME

BACKGROUND OF THE INVENTION

1. Field of the Invention

The technical field relates to a light source (a lighting device), a device having a light source, and the like.

2. Description of the Related Art

For example, a light source (a lighting device) having an electroluminescent element which is disclosed in Patent Document 1 is known.

[Patent Document 1] Japanese Published Patent Application No. 2004-134282

SUMMARY OF THE INVENTION

FIG. 33 is a conceptual drawing of a conventional light source (lighting device).

In FIG. 33, a first electrode 20, an electroluminescence layer 30, and a second electrode 40 are sequentially stacked over a substrate 10.

When a pinhole 80 is generated in the second electrode 40, moisture 91 and moisture 92 enter through the pinhole 80, leading to deterioration of the electroluminescence layer 30.

The electroluminescence layer 30 is likely to allow moisture to penetrate therethrough.

Therefore, when the pinhole is generated even at one place of the second electrode 40, moisture penetrates through the electroluminescence layer 30, causing deterioration of the whole electroluminescence layer 30.

The deterioration of the whole electroluminescence layer 30 makes it impossible to use the light source itself.

Structures for solving the above problem are disclosed below.

The structures include a plurality of island-shaped electroluminescence layers.

That is, an electroluminescence layer is divided into plural layers.

By providing the plurality of island-shaped electroluminescence layers between a pair of common electrodes, even when moisture penetrates into one of the island-shaped electroluminescence layers, the moisture does not penetrate into another of the island-shaped electroluminescence layers.

Therefore, a pinhole generated at one place of the electrode is only allowed to cause the deterioration of the island-shaped electroluminescence layer that overlaps with a portion where the pinhole is generated.

Thus, the conventional situation in which the generation of the pinhole only at one place of the electrode makes it impossible to use the light source itself can be prevented.

Note that when the plurality of island-shaped electroluminescence layers are interposed between the pair of electrodes, the pair of electrodes are in contact with each other at a place where no island-shaped electroluminescence layer is provided, resulting in a short circuit.

Therefore, a nonconductive layer (an insulating layer or a semiconducting layer) is preferably provided at the place where no island-shaped electroluminescence layer is provided. Any structure may be employed as long as the nonconductive layer exists between the pair of electrodes at the region where the plurality of island-shaped electroluminescence layers is not provided.

Further, electric field concentration is likely to occur at end portions (edge portions) of the island-shaped electroluminescence layers, and easily allows deterioration of the end portions.

However, by providing the end portions (edge portions) of the island-shaped electroluminescence layers so as to overlap with the nonconductive layer, an electric field can be prevented from being concentrated at a portion that contributes to light emission.

In other words, when the island-shaped electroluminescence layers are provided over the nonconductive layer, their end portions (edge portions) become sacrificial regions which do not contribute to light emission, by being provided so as to overlap with the nonconductive layer.

In contrast, when the island-shaped electroluminescence layers are provided under the nonconductive layer, by providing their end portions (edge portions) so as to overlap with the nonconductive layer, the nonconductive layer becomes a layer that relieves an electric field applied from the second electrode.

Thus, it is possible to provide a light source comprising a first electrode, a nonconductive layer including a plurality of opening portions over the first electrode, a plurality of island-shaped electroluminescence layers over the first electrode exposed in the plurality of opening portions, and a second electrode covering the plurality of island-shaped electroluminescence layers, and an end portion of the plurality of island-shaped electroluminescence layers is formed over the nonconductive layer.

It is possible to provide a light source comprising a first electrode, a nonconductive layer including a plurality of opening portions and being formed by making the first electrode have an insulating surface, a plurality of island-shaped electroluminescence layers over the first electrode exposed in the plurality of opening portions, and a second electrode covering the plurality of island-shaped electroluminescence layers, and an end portion of the plurality of island-shaped electroluminescence layers is formed over the nonconductive layer.

It is possible to provide a light source comprising a first electrode, a plurality of island-shaped electroluminescence layers over the first electrode, a nonconductive layer including a plurality of opening portions over the first electrode, and a second electrode over the nonconductive layer and over the plurality of island-shaped electroluminescence layers exposed in the plurality of opening portions, and the nonconductive layer is formed to cover an end portion of the plurality of island-shaped electroluminescence layers.

It is possible to provide a light source comprising a first electrode, a plurality of island-shaped electroluminescence layers over the first electrode, a plurality of island-shaped electrodes formed over the plurality of island-shaped electroluminescence layers, a nonconductive layer filling a space between a plurality of stack structures each including one of the plurality of island-shaped electroluminescence layers and one of the plurality of island-shaped electrodes, and a second electrode over the plurality of island-shaped electrodes and over the nonconductive layer.

Preferably, a sidewall of the plurality of opening portions has a tapered shape.

Preferably, cutting holes forming a dashed line are provided between the plurality of island-shaped electroluminescence layers.

It is possible to provide a device comprising a light source in which a plurality of island-shaped electroluminescence layers are provided between a pair of electrodes and a light guide plate provided to face the light source. The light source is preferably a dual-emission light source.

It is possible to provide a device comprising a light source in which a plurality of island-shaped electroluminescence layers are provided between a pair of electrodes, a display panel, and a light guide plate between the light source and the display panel. The light source is preferably a dual-emission light source.

The structure in which the plurality of island-shaped electroluminescence layers are interposed between the pair of electrodes can prevent deterioration of the light source.

By providing the nonconductive layer (an insulating layer or a semiconducting layer) at a place where no electroluminescence layer is provided, a short circuit between the pair of electrodes can be prevented.

By providing the end portions (edge portions) of the island-shaped electroluminescence layers so as to overlap with the nonconductive layer, it is possible to prevent deterioration of a region that contributes to light emission in the island-shaped electroluminescence layers.

DETAILED DESCRIPTION OF THE INVENTION

Figure 1A:
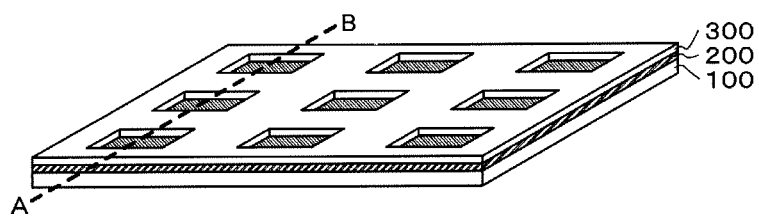
FIGS. 1A and 1B illustrate an example of a method for fabricating a light source.

Embodiments will be described in detail with reference to the accompanying drawings.

It is easily understood by those skilled in the art that modes and details of the present invention can be modified in various ways without departing from the spirit of the invention.

Therefore, the present invention should not be interpreted as being limited to the description of the embodiments below.

In the structures to be given below, the same portions or portions having similar functions are denoted by the same reference numerals in different drawings, and explanation thereof will not be repeated.

The embodiments given below can be combined with each other, as appropriate.

The number of the opening portions, the number of the electroluminescence layers, the number of connection portions, and the like are not limited to those described in the embodiments or those shown in the drawings.

Embodiment 1

An example of a method for fabricating the light source is described using FIGS. 1A and 1B, FIGS. 2A and 2B, and FIGS. 3A and 3B.

Note that dashed lines A-B in the cross-sectional views correspond to dashed lines A-B in the perspective views.

Figure 1B:
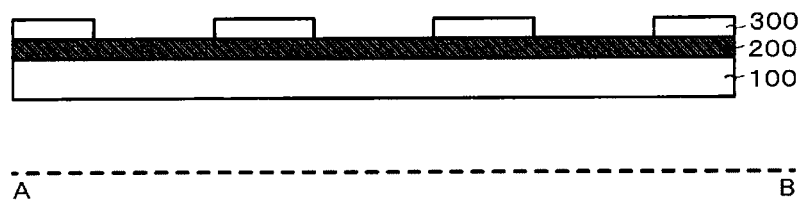

A first electrode 200 is formed over a first substrate 100, and a nonconductive layer 300 having a plurality of opening portions is formed over the first electrode 200. (FIGS. 1A and 1B)

Note that the nonconductive layer is an insulating layer or a semiconductor layer.

An insulating film, a circuit, or the like may be formed between the first substrate 100 and the first electrode 200.

Figure 2A:
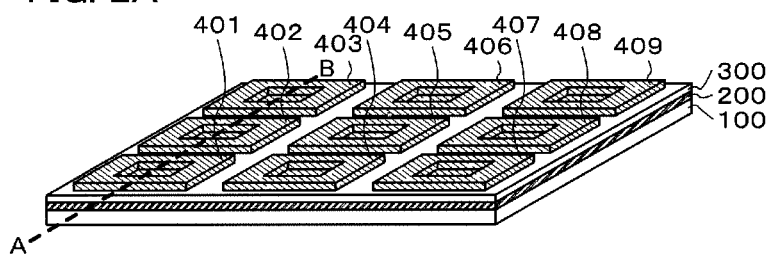
FIGS. 2A and 2B illustrate the example of the method for fabricating the light source.
Figure 2B:
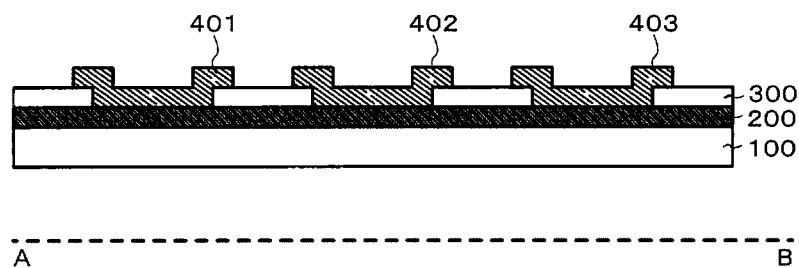

Next, island-shaped electroluminescence layers 401 to 409 are formed over the first electrode 200 exposed in the plurality of opening portions. (FIGS. 2A and 2B)

The plurality of island-shaped electroluminescence layers are provided at positions corresponding to the plurality of opening portions.

Figure 3A:
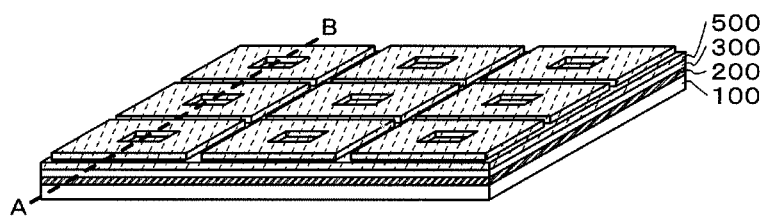
FIGS. 3A and 3B illustrate the example of a method for fabricating the light source.
Figure 3B:
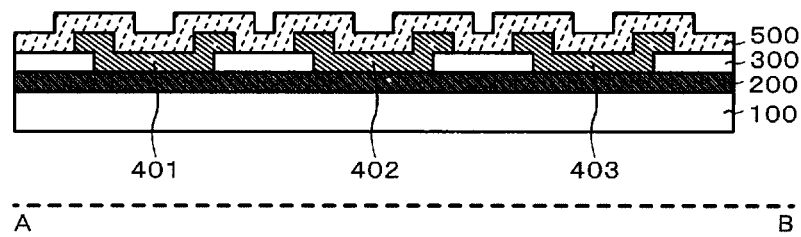

Next, a second electrode 500 is formed to cover the island-shaped electroluminescence layers 401 to 409. (FIGS. 3A and 3B)

Then, a second substrate is placed on the second electrode 500 side so as to face the first substrate, and sealing is performed using a sealant.

Note that before the sealing, a protective film which covers the second electrode 500 is preferably provided. Further, to perform the sealing, only the protective film or both the protective film and a protective film sheet which protects the protective film from friction may be used. The way in which the sealing is thus performed using the protective film without the second substrate is referred to as film sealing. Performing the film sealing and using a flexible substrate as the first substrate can make the light source thin and lightweight.

By providing the plurality of island-shaped electroluminescence layers between the common first electrode and the common second electrode as above, deterioration of the light source can be prevented.

Further, a short circuit between the first and second electrodes can be prevented by the provision of the nonconductive layer having the plurality of opening portions and the arrangement in which the plurality of island-shaped electroluminescence layers are provided at positions corresponding to the plurality of opening portions.

The second electrode covers end portions (edge portions) of the island-shaped electroluminescence layers, and therefore, a voltage is applied through top and side surfaces of the end portions (edge portions). Accordingly, electric field concentration is likely to occur at the end portions (edge portions) and easily allows them to undergo deterioration.

However, electric field concentration at the portion that contributes to light emission can be prevented, because the end portions (edge portions) are provided so as to overlap with the insulating layer and accordingly become portions that do not contribute to light emission.

That is, by being provided to overlap with the insulating layer, the end portions (edge portions) become the sacrificial regions.

Thus, in other words, the electric field concentration at the portion that contributes to light emission can be prevented by making the end portions (edge portions) of the island-shaped electroluminescence layers become the sacrificial regions which do not contribute to light emission. Accordingly, it is possible to prevent the deterioration of the portion that contributes to light emission.

Therefore, as in FIGS. 2A and 2B and FIGS. 3A and 3B, the peripheral end portions (all the edge portions) of the island-shaped electroluminescence layers are preferably provided to overlap with the nonconductive layer.

In other words, it is preferable that the area of the island-shaped electroluminescence layer exceed the area of the opening portion in the nonconductive layer (that the island-shaped electroluminescence layer be a size larger than the opening portion).

Further, another effect of the island-shaped electroluminescence layer exceeding the opening portion in area is that even a change in the position of the island-shaped electroluminescence layer does not cause exposure of the first electrode.

Thus, the area of the island-shaped electroluminescence layer is preferably larger than the area of the opening portion in the nonconductive layer.

Furthermore, a sidewall of the opening portion provided in the nonconductive layer 300 preferably has a tapered shape, because breakages of the plurality of island-shaped electroluminescence layers can be prevented in this case.

This embodiment can be combined with any other embodiment.

Embodiment 2

In this embodiment, materials and a fabrication method are described.

As the first and second substrates, a substrate having a light-transmitting property, a substrate having a light-shielding property, or the like can be used.

As the substrate having a light-transmitting property, there are a glass substrate, a quartz substrate, a plastic substrate having a light-transmitting property, and the like.

As the substrate having a light-shielding property, there are a plastic substrate having a light-shielding property, a metal (e.g., stainless steel or aluminum) substrate, a semiconductor substrate (e.g., a silicon wafer), a paper substrate, and the like.

Because light extraction needs to be realized from the light source, at least one of the first and second substrates has a light-transmitting property.

It is needless to say that both the first and second substrates may have a light-transmitting property.

Note that a plastic substrate, a metal substrate, a paper substrate, and the like can easily be made flexible by having a small thickness.

The use of flexible substrates as both the first and second substrates can provide a flexible light source.

The flexible light source is preferable in that it has suppleness and does not easily crack.

Further, the use of a flexible substrate facilitates cutting with scissors, a cutter, or the like, whereby a light source capable of being shaped as desired can also be provided.

The first and second electrodes can be formed using, but not limited to, metal, an oxide conductor, or the like.

For instance, as the first and second electrodes, metal nitride, metal oxide, or a metal alloy which has conductivity may be used.

The first and second electrodes may have a single-layer structure or a stack structure.

Examples of the metal include, but not limited to, tungsten, titanium, aluminum, molybdenum, gold, silver, copper, platinum, palladium, iridium, alkali metal, alkaline-earth metal, and the like.

Examples of the oxide conductor include, but not limited to, indium tin oxide, zinc oxide, zinc oxide containing indium, zinc oxide containing indium and gallium, and the like.

A material having a low work function (e.g., alkali metal, alkaline-earth metal, a magnesium-silver alloy, an aluminum-lithium alloy, or a magnesium-lithium alloy) is preferably applied to a cathode.

A material having a high work function (e.g., an oxide conductor) is preferably applied to an anode.

Because light extraction needs to be realized from the light source, at least one of the first and second electrodes has a light-transmitting property.

When both the first and second electrodes and both the first and second substrates each have a light-transmitting property, it is possible to provide a light source in which light can be extracted from both surfaces (a dual-emission light source).

Note that an oxide conductor has a light-transmitting property.

Further, a light-transmitting property can be realized even with metal, metal nitride, metal oxide, or a metal alloy by a reduction in thickness (a thickness of 50 nm or less is preferable).

When the thickness is reduced so that a light-transmitting property is realized with metal, metal nitride, metal oxide, or a metal alloy, the resistance value of the electrode is increased.

Therefore, the resistance value of the electrode can be decreased by using metal, metal nitride, metal oxide, a metal alloy, or the like for a surface in contact with the electroluminescence layer and using an oxide conductor for a surface that is not in contact with the electroluminescence layer.

In particular, a material having a low work function is preferably used as the surface that is in contact with the electroluminescence layer, because both the values of the work function and the resistance can be made suitable in this case.

The nonconductive layer is an insulating layer or a semiconductor layer.

As the insulating layer, an organic insulating layer or an inorganic insulating layer can be used.

For the organic insulating layer, resist, acrylic, polyimide, or the like can be used, but the present invention is not limited to these materials.

For the inorganic insulating layer, diamond-like carbon, silicon nitride, silicon oxynitride, silicon nitride oxide, silicon oxide, aluminum nitride, aluminum oxynitride, aluminum nitride oxide, or the like can be used, but the present invention is not limited to these materials.

For the semiconductor layer, silicon, silicon germanium, germanium, an oxide semiconductor, or the like can be used, but the present invention is not limited to these materials.

Examples of the oxide semiconductor include, but not limited to, In—Ga—Zn—O-based oxide (containing indium, gallium, zinc, and oxygen as the main components), In—Sn—Zn—O-based oxide (containing indium, tin, zinc, and oxygen as the main components), In—Al—Zn—O-based oxide (containing indium, aluminum, zinc, and oxygen as the main components), Sn—Ga—Zn—O-based oxide (containing tin, gallium, zinc, and oxygen as the main components), Al—Ga—Zn—O-based oxide (containing aluminum, gallium, zinc, and oxygen as the main components), Sn—Al—Zn—O-based oxide (containing tin, aluminum, zinc, and oxygen as the main components), In—Zn—O-based oxide (containing indium, zinc, and oxygen as the main components), Sn—Zn—O-based oxide (containing tin, zinc, and oxygen as the main components), Al—Zn—O-based oxide (containing aluminum, zinc, and oxygen as the main components), In—O-based oxide (oxide of indium (indium oxide)), Sn—O-based oxide (oxide of tin (tin oxide)), Zn—O-based oxide (oxide of zinc (zinc oxide)), and the like.

The oxide semiconductor has a light-transmitting property higher than that of an organic insulating layer, an inorganic insulating layer, silicon, silicon germanium, germanium, and the like. Therefore, the use of the oxide semiconductor as the nonconductive layer can improve the efficiency of the light extraction.

The carrier density of the oxide semiconductor is preferably low because the oxide semiconductor could exhibit conductivity by containing many carriers (e.g., hydrogen or oxygen deficiencies) in this case.

The carrier density is preferably $1\times10^{19}$ cm$^{-3}$ or less (more preferably $1\times10^{16}$ cm$^{-3}$ or less, further preferably $1\times10^{14}$ cm$^{-3}$ or less, still further preferably $1\times10^{12}$ cm$^{-3}$ or less).

It is preferred that the nonconductive layer be, but not limited to, an amorphous semiconductor layer because the nonconductive layer preferably has high resistance.

Since the nonconductive layer preferably has high resistance, it is preferable that intentional addition of an impurity imparting a conductivity type be avoided, but the present invention is not limited to this mode.

The nonconductive layer may be a single layer or a stacked layer.

In particular, the nonconductive layer preferably has a stack structure in which a metal layer is interposed between a pair of insulating layers.

Metal has a high thermal conductivity and thus serves as a heat-radiation material.

Since the electroluminescence layer is sensitive to heat, provision of the heat-radiation material can prevent deterioration of the electroluminescence layer.

In the stack structure of the nonconductive layer in which the metal layer is interposed between the pair of insulating layers, heat conducted from the electroluminescence layer to the electrode can be conducted to the metal through the insulating layer and radiated.

Note that in the stack structure in which the metal layer is interposed between the pair of insulating layers, the problem of a short circuit does not occur because the metal layer is in a floating state.

Thus, it is preferable to form a state in which a sidewall of the metal layer is in contact with part of the island-shaped electroluminescence layers by forming the opening portions in the pair of insulating layers and the metal layer at a single time, because heat can be directly radiated in this state.

By forming the opening portion that is larger in the metal layer than in the pair of insulating layers, it is also possible to form a state in which the sidewall of the metal layer is not in contact with the island-shaped electroluminescence layer.

Furthermore, when the pair of nonconductive layers is formed using silicon nitride, diamond-like carbon, aluminum nitride oxide, aluminum nitride, or the like, which are known as heat-radiation insulating layers, the effect of heat radiation can be improved.

In particular, aluminum nitride oxide, aluminum nitride, and the like are preferable.

Note that the same effect can be gained even by use of a single layer of the heat-radiation insulating layer.

Note also that the thermal conductivity of aluminum nitride is 170 W/m·K to 180 W/m·K, that of silver is 420 W/m·K, that of copper is 398 W/m·K, that of gold is 320 W/m·K, and that of aluminum is 236 W/m·K. For this reason, the stack structure in which the metal layer is interposed between the pair of insulating layers can be said to be preferred.

For the metal layer, any material such as gold, silver, copper, platinum, aluminum, molybdenum, tungsten, or an alloy may be used as long as the material is a kind of metal.

Gold, silver, copper, aluminum, and the like are particularly preferable because they each have a high thermal conductivity.

Since the thermal conductivity of silicon is 168 W/m·K, silicon is preferable as a heat-radiation material. (The thermal conductivity of an insulator is generally 10 W/m·K or less in many cases.)

Therefore, it is also preferable to use a structure in which the metal layer is interposed between a pair of silicon layers.

Note that the pair of nonconductive layers may be a combination of different materials.

In other words, between a first nonconductive layer and a second nonconductive layer, a layer having a thermal conductivity higher than those of the first and second nonconductive layers may be interposed.

Thus, an insulating layer may be interposed between the pair of insulating layers, or a semiconductor layer may be interposed between the pair of insulating layers.

Note that the thermal conductivity of a diamond-like carbon film is 400 W/m·K to 1800 W/m·K (varying depending on the film formation method).

When the first and second electrodes are each made to have a light-transmitting property to fabricate the dual-emission light source, a background can be kept out of sight by using the stack structure in which the metal layer is interposed between the pair of nonconductive layers.

For instance, when the dual-emission light source is provided on a wall so as to illuminate two adjacent rooms, the background that can be seen allows one room to be glanced at from the other room. Therefore, in the case where one room is not desired to be glanced at from the other room, for example, keeping the background out of sight is effective.

Note that when the background is merely kept out of sight, the nonconductive layer may preferably be formed of a material having a light-shielding property, such as black resin.

In a dual-emission light source in which a reflective electrode is not used, utilization of reflected light has been precluded. However, by employing the stack structure in which the metal layer is interposed between the pair of nonconductive layers, the metal layer reflects part of electroluminescence that is emitted in every direction, enabling the utilization of reflected light.

It is needless to say that, a one-side emission light source can also have improved reflection efficiency by having the stack structure in which the metal layer is interposed between the pair of nonconductive layers.

The electroluminescence layer has a light-emitting unit including a light-emitting layer. A light-emitting layer containing an organic compound can be given as an example of the light-emitting layer.

The light-emitting unit may include an electron-injection layer, an electron-transport layer, a hole-injection layer, a hole-transport layer, and the like in addition to the light-emitting layer.

There is no limitation on the light-emitting unit as long as it exhibits light emission by application of a voltage.

Therefore, an inorganic electroluminescence material may be used for the light-emitting unit.

In addition, the electroluminescence layer can have an improved luminance by including a plurality of light-emitting units and a charge generation layer partitioning the plurality of light-emitting units.

For the charge generation layer, metal, an oxide conductor, a stack structure of metal oxide and an organic compound, a mixture of metal oxide and an organic compound, or the like can be used.

For the charge generation layer, use of the stack structure of metal oxide and an organic compound, the mixture of metal oxide and an organic compound, or the like is preferred, because such materials allow hole injection in the direction of the cathode and electron injection in the direction of the anode upon application of a voltage.

Examples of the metal oxide that is preferably used for the charge generation layer include oxide of transition metal, such as vanadium oxide, niobium oxide, tantalum oxide, a chromium oxide, molybdenum oxide, tungsten oxide, manganese oxide, and rhenium oxide.

As the organic compound used for the charge generation layer, an amine-based compound (an arylamine compound in particular), a carbazole derivative, aromatic hydrocarbon, Alq, or the like is preferably used, because these materials form a charge-transfer complex with the oxide of transition metal.

As the sealant, thermosetting epoxy resin, light curable epoxy resin, or the like can be used, but the present invention is not limited to these materials. The sealant may be merely an adhesive agent.

For the protective film, an inorganic compound such as diamond-like carbon, silicon nitride, silicon oxynitride, silicon nitride oxide, silicon oxide, aluminum nitride, aluminum oxynitride, and aluminum nitride oxide are preferable, because these compounds can block moisture; however the present invention is not limited to these materials. The protective film may have a stack structure.

Note that as a method of processing and shaping the insulating film, the electroluminescence layer, the first and second electrodes, or the like as desired, a method employing photolithography, a method with a metal mask, or the like may preferably be used. Alternatively, an inkjet method or the like may be used to directly form a pattern (the plurality of island-shaped electroluminescence layers).

This embodiment can be combined with any other embodiment.

Embodiment 3

Tapered shapes are described using FIGS. 31A to 31D.

In each of FIGS. 31A to 31D, the first electrode 200 is formed over the first substrate 100, and the nonconductive layer 300 having an opening portion is provided over the first electrode 200.

Figure 31A:
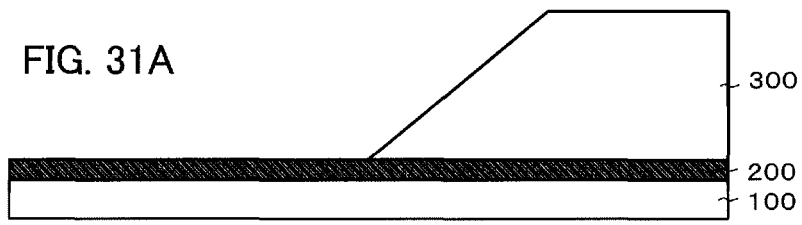
FIGS. 31A to 31D show comparison between tapered shapes and a reverse tapered shape.

Here, the tapered shape taken by the sidewall of the opening portion means a shape in which a bevelled portion of the opening portion opens in a downward direction in a cross-section. (FIG. 31A)

Figure 31B:
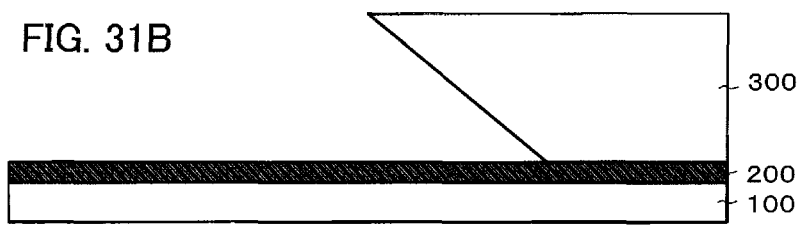

In contrast, a reverse tapered shape taken by the sidewall of the opening portion means a shape in which the bevelled portion of the opening portion opens in an upward direction in a cross-section. (FIG. 31B)

A non-tapered shape taken by the sidewall of the opening portion means a shape having a right angle between the bevelled portion of the opening portion and a surface of the first electrode in a cross-section.

The tapered shape is superior to the reverse tapered shape and the non-tapered shape in that the tapered shape can prevent the breakages of the plurality of island-shaped electroluminescence layers (or the second electrode).

Figure 31C:
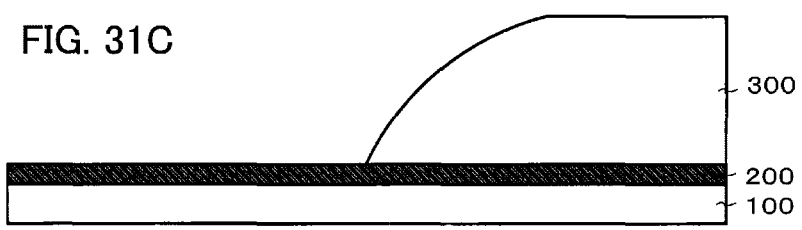
Figure 31D:
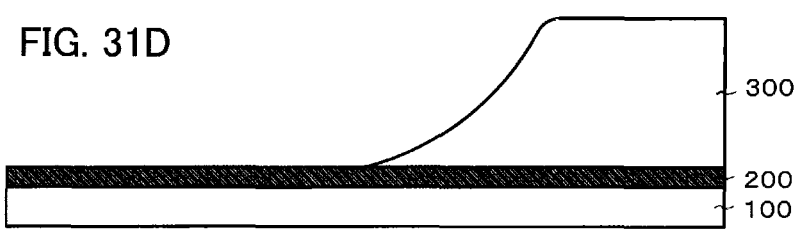

Note that the tapered shape is not necessarily rectilinear and may have a curve. (FIGS. 31C and 31D)

This embodiment can be combined with any other embodiment.

Embodiment 4

An example of a method for fabricating the light source is described using FIGS. 4A and 4B, FIGS. 5A and 5B, FIGS. 6A to 6C, FIGS. 7A and 7B, and FIGS. 8A and 8B.

Note that dashed lines A-B in the cross-sectional views correspond to dashed lines A-B in the perspective views.

Figure 4A:
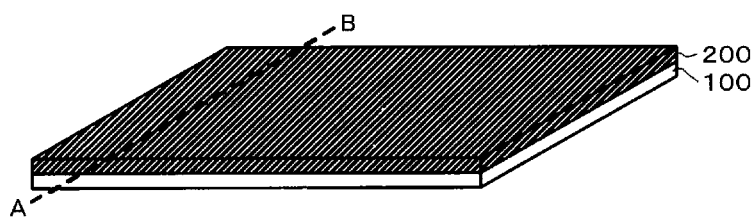
FIGS. 4A and 4B illustrate an example of a method for fabricating a light source.
Figure 4B:
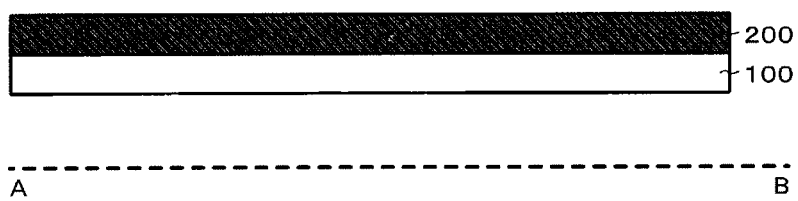

The first electrode 200 is formed over the first substrate 100. (FIGS. 4A and 4B)

An insulating film, a circuit, or the like may be formed between the first substrate 100 and the first electrode 200.

Figure 5A:
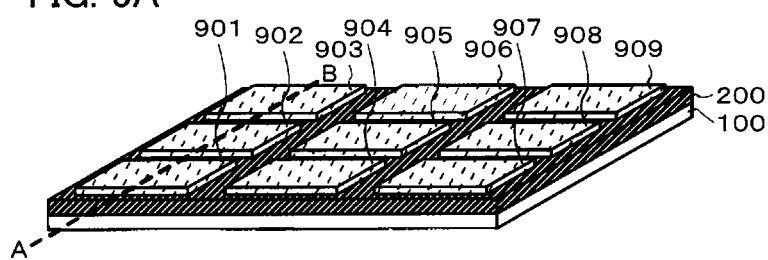
FIGS. 5A and 5B illustrate the example of the method for fabricating the light source.
Figure 5B:
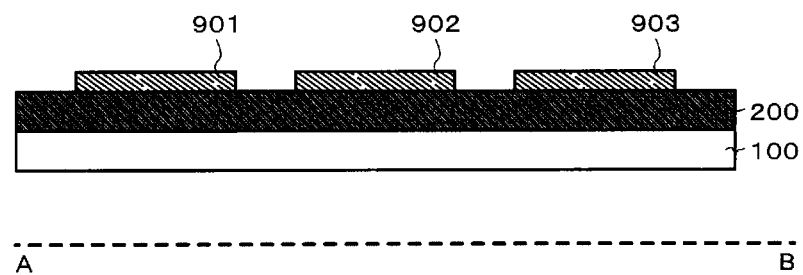

Next, masks 901 to 909 are formed over the first electrode 200. (FIGS. 5A and 5B)

The mask can be a mask formed of an organic material, a mask formed of an inorganic material, or the like.

For the mask formed of an organic material, resist, acrylic, polyimide, materials used for an organic electroluminescence layer, or the like can be used.

For the mask formed of an inorganic material, silicon oxide, silicon nitride, or the like can be used.

Note that as a method of processing and shaping the masks 901 to 909 as desired, a film formation method with a metal mask, a photolithography method with a photomask, or the like can be used.

Figure 6A:
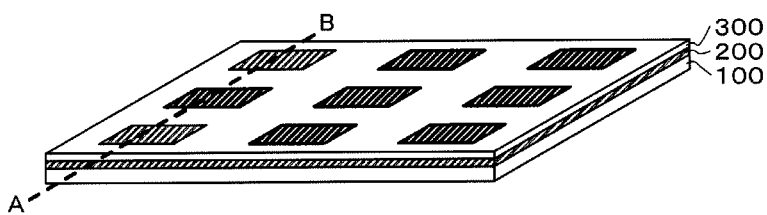
FIGS. 6A to 6C illustrate the example of the method for fabricating the light source.
Figure 6B:
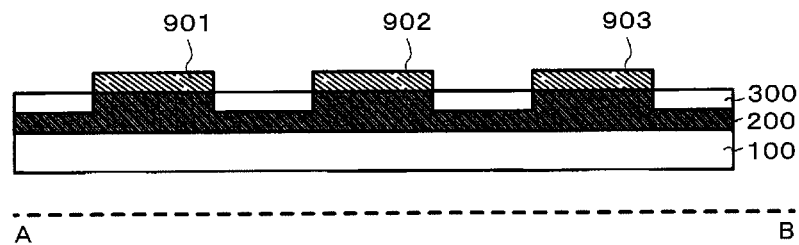
Figure 6C:
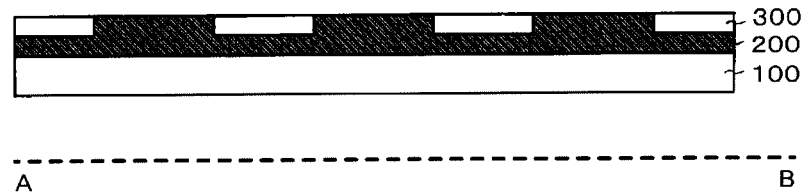

Next, after the exposed surface of the first electrode 200 is made to have an insulating property to form the nonconductive layer 300, the masks 901 to 909 are removed. (FIGS. 6A to 6C)

Being made to have an insulating property means performing oxidation, nitridation, or the like.

Note that the first electrode may be a single layer or a stacked layer as long as metal is used for the surface.

The oxidation can be performed by ozone surface treatment (e.g., ozone water treatment or treatment in an ozone atmosphere), heat treatment in an oxygen atmosphere, oxygen plasma treatment, heat treatment in a steam atmosphere, water plasma treatment, or the like.

The nitridation can be performed by heat treatment in a nitrogen atmosphere, nitrogen plasma treatment, or the like.

When the mask formed of an organic material is used, ozone surface treatment, oxygen plasma treatment, or water plasma treatment removes end portions of the masks 901 to 909 as well, whereby each of the masks 901 to 909 is diminished in size. (FIG. 6B)

Accordingly, there is a reduction in the area of each of regions that are not made to have an insulating property (a plurality of opening portions or exposed portions) in the first electrode.

Therefore, when the metal mask or the photomask used in order to form the masks 901 to 909 is used again for the purpose of forming the island-shaped electroluminescence layers, the peripheral edge portions (all the end portions) of the island-shaped electroluminescence layers can be provided so as to overlap with the regions that are made to have an insulating property.

Thus, the metal mask or the photomask is preferably used again in a different process in that the metal masks or the photomasks can be diminished in number, providing a cost reduction.

It is needless to say that the metal mask or the photomask used to form the masks may be different from that used to form the island-shaped electroluminescence layers.

Figure 7A:
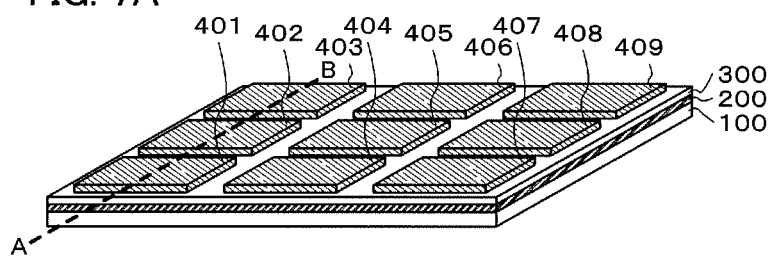
FIGS. 7A and 7B illustrate the example of the method for fabricating the light source.
Figure 7B:
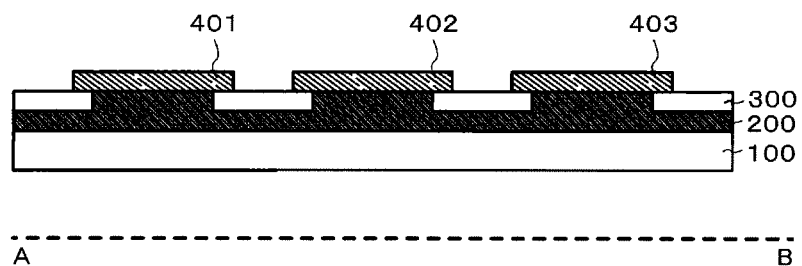

Next, the island-shaped electroluminescence layers 401 to 409 are formed over the exposed first electrode. (FIGS. 7A and 7B)

The plurality of island-shaped electroluminescence layers are provided at positions corresponding to the plurality of opening portions (plurality of exposed portions).

Figure 8A:
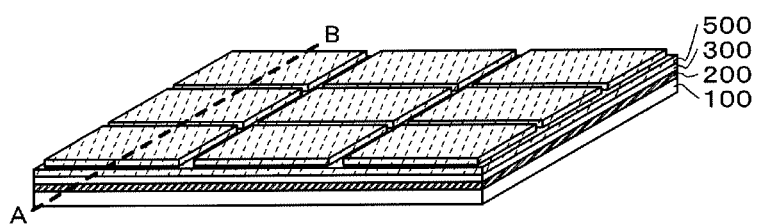
FIGS. 8A and 8B illustrate the example of the method for fabricating the light source.
Figure 8B:
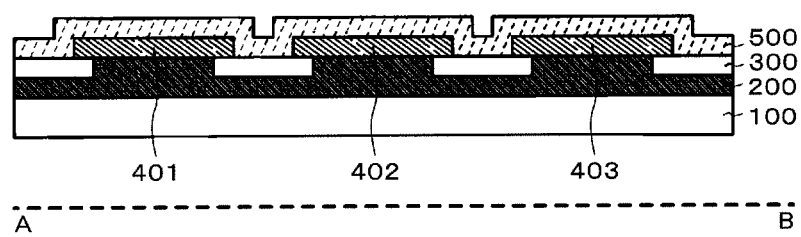

Next, the second electrode 500 is formed to cover the island-shaped electroluminescence layers 401 to 409. (FIGS. 8A and 8B)

Then, the second substrate is placed on the second electrode 500 side so as to face the first substrate, and sealing is performed using the sealant.

Note that before the sealing is performed, the protective film covering the second electrode 500 is preferably provided.

In this embodiment as well, a short circuit between the first and second electrodes can be prevented.

Further, it is preferable to provide the end portions (edge portions) of the island-shaped electroluminescence layers on the surface of the first electrode which is made to have an insulating property.

Therefore, as in FIGS. 7A and 7B and FIGS. 8A and 8B, the peripheral end portions (all the edge portions) of the island-shaped electroluminescence layers are preferably provided to overlap with the insulating surface.

This embodiment is preferable in that the surface of the second electrode and the insulating surface are flat so that the breakages of the electroluminescence layers at a step are avoided.

This embodiment can be combined with any other embodiment.

Embodiment 5

An example of the method for fabricating the light source is described using FIGS. 9A and 9B, FIGS. 10A and 10B, and FIGS. 11A and 11B.

Note that dashed lines A-B in the cross-sectional views correspond to dashed lines A-B in the perspective views.

Figure 9A:
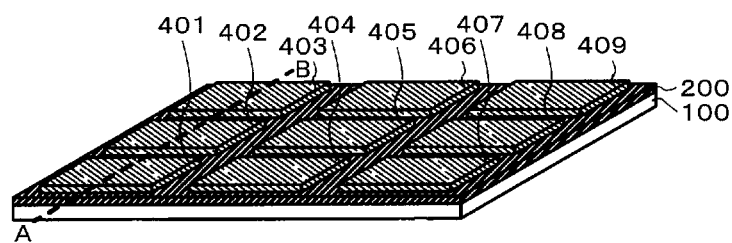
FIGS. 9A and 9B illustrate an example of a method for fabricating a light source.
Figure 9B:
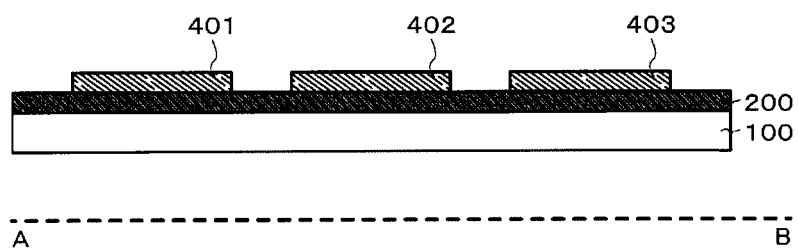

The first electrode 200 is formed over the first substrate 100, and the island-shaped electroluminescence layers 401 to 409 are formed over the first electrode 200. (FIGS. 9A and 9B)

An insulating film, a circuit, or the like may be formed between the first substrate 100 and the first electrode 200.

Figure 10A:
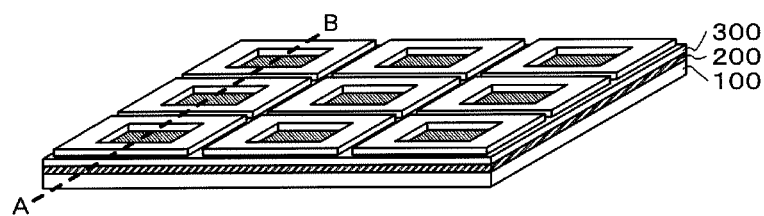
FIGS. 10A and 10B illustrate the example of the method for fabricating the light source.
Figure 10B:
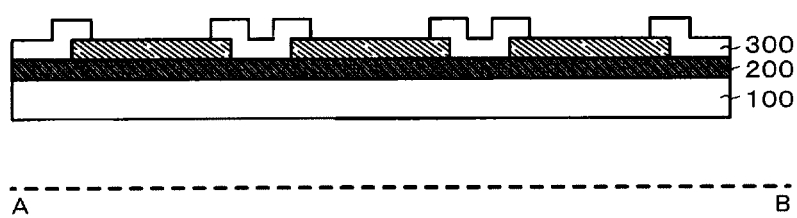

Next, the nonconductive layer 300 is formed to overlap with the island-shaped electroluminescence layers 401 to 409 and to have a plurality of opening portions at positions corresponding to the island-shaped electroluminescence layers 401 to 409. (FIGS. 10A and 10B)

Figure 11A:
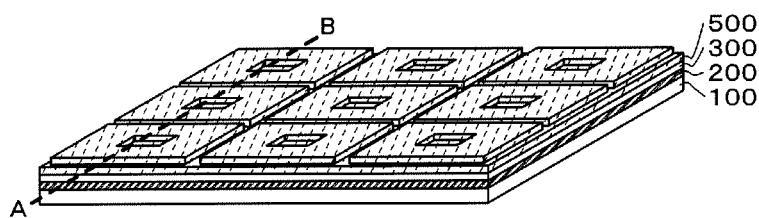
FIGS. 11A and 11B illustrate the example of the method for fabricating the light source.
Figure 11B:
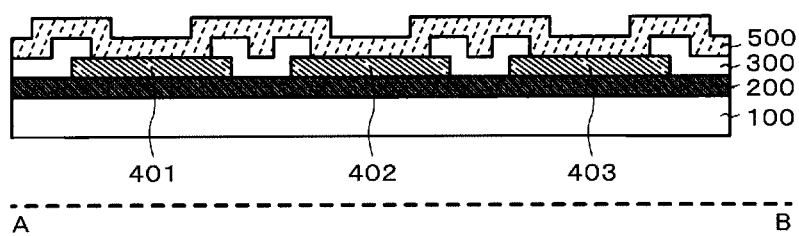

Next, the second electrode 500 is formed over the nonconductive layer 300 and over the island-shaped electroluminescence layers 401 to 409 exposed in the plurality of opening portions. (FIGS. 11A and 11B)

Then, the second substrate is placed on the second electrode 500 side so as to face the first substrate, and sealing is performed using the sealant.

Note that before the sealing is performed, the protective film covering the second electrode 500 is preferably provided.

In this embodiment as well, a short circuit between the first and second electrodes can be prevented.

Since the island-shaped electroluminescence layers are formed on the flat surface of the first electrode, breakages of the island-shaped electroluminescence layers can be prevented.

By overlapping with the nonconductive layer, the end portions (edge portions) of the island-shaped electroluminescence layers can be protected by the nonconductive layer.

That is, covering the end portions (edge portions) with the nonconductive layer can relieve an electric field applied to the end portions (edge portions).

Therefore, as in FIGS. 10A and 10B and FIGS. 11A and 11B, the peripheral end portions (all the edge portions) of the island-shaped electroluminescence layers are preferably provided to overlap with the nonconductive layer.

Furthermore, the sidewall of the opening portion provided in the nonconductive layer 300 preferably has a tapered shape, because breakages of the second electrode can be prevented in this case.

This embodiment can be combined with any other embodiment.

Embodiment 6

An example of the method of fabricating the light source is described using FIGS. 12A and 12B, FIGS. 13A and 13B FIGS. 14A and 14B, and FIGS. 15A and 15B.

Note that dashed lines A-B in the cross-sectional views correspond to dashed lines A-B in the perspective views.

Figure 12A:
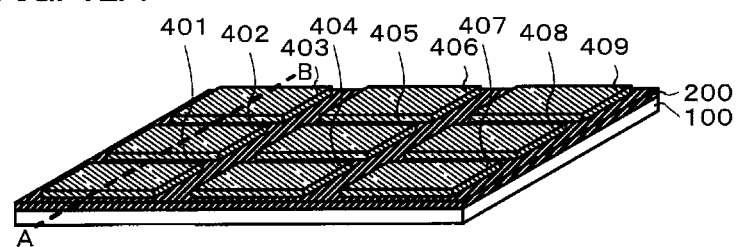
FIGS. 12A and 12B illustrate an example of a method for fabricating a light source.
Figure 12B:
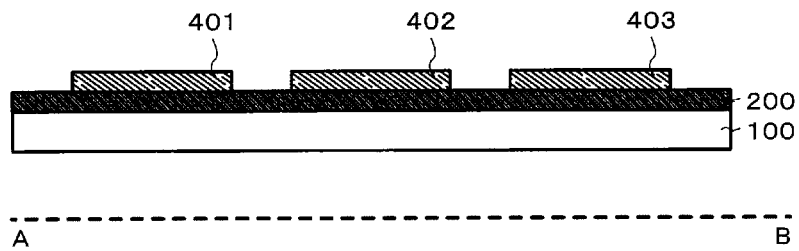

The first electrode 200 is formed over the first substrate 100, and the island-shaped electroluminescence layers 401 to 409 are formed over the first electrode. (FIGS. 12A and 12B)

An insulating film, a circuit, or the like may be formed between the first substrate 100 and the first electrode 200.

Figure 13A:
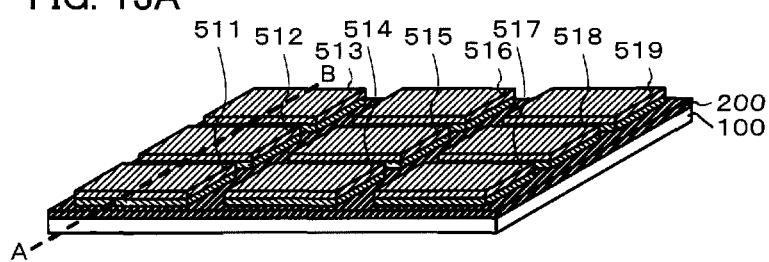
FIGS. 13A and 13B illustrate the example of the method for fabricating the light source.
Figure 13B:
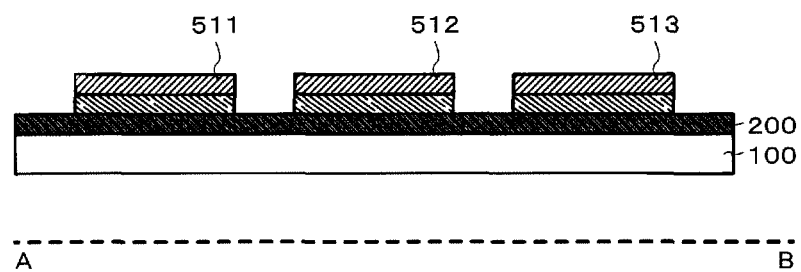

Next, island-shaped electrodes 511 to 519 are formed over the island-shaped electroluminescence layers 401 to 409. (FIGS. 13A and 13B)

Materials of the island-shaped electrodes can be the same as those of the first and second electrodes.

The plurality of island-shaped electrodes are provided at positions corresponding to the plurality of electroluminescence layers.

A first method which includes the following steps may be used: forming an electroluminescence layer, forming the plurality of island-shaped electrodes over the electroluminescence layer, and forming a plurality of island-shaped electroluminescence layers by etching the electroluminescence layer with the use of the plurality of island-shaped electrodes as masks.

Alternatively, a second method which includes the following steps may be used: forming an electroluminescence layer, forming a conductive film over the electroluminescence layer, forming a plurality of masks (e.g., a plurality of resist masks) over the conductive film, and forming a plurality of electroluminescence layers by etching the electroluminescence layer at the same time as forming the plurality of island-shaped electrodes by etching the conductive film with the use of the plurality of masks.

The use of the first method or the second method can simplify the process of forming the plurality of island-shaped electroluminescence layers and forming the plurality of island-shaped electrodes.

Figure 14A:
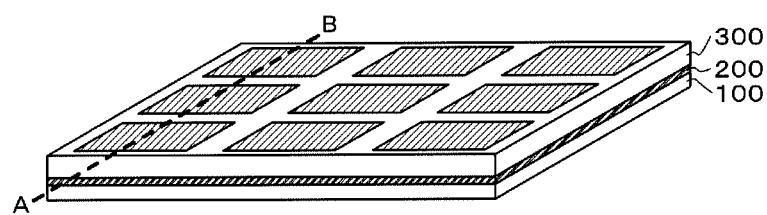
FIGS. 14A and 14B illustrate the example of the method for fabricating the light source.
Figure 14B:
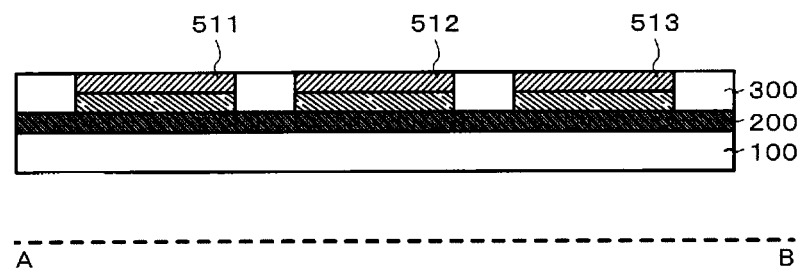

Next, after a nonconductive film covering the plurality of island-shaped electrodes is formed, the nonconductive film is subjected to etch back or polishing (e.g., mechanical polishing or chemical mechanical polishing (CMP)), thereby forming the nonconductive layer 300 filling spaces between stack structures of the plurality of island-shaped electroluminescence layers and the plurality of island-shaped electrodes. (FIGS. 14A and 14B)

Figure 15A:
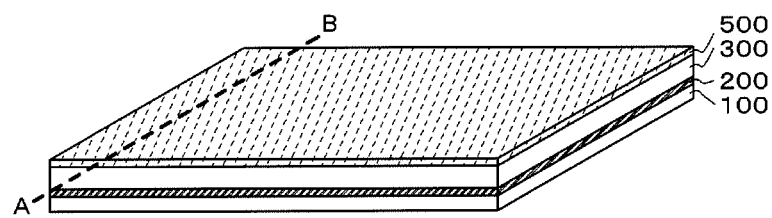
FIGS. 15A and 15B illustrate the example of the method for fabricating the light source.
Figure 15B:
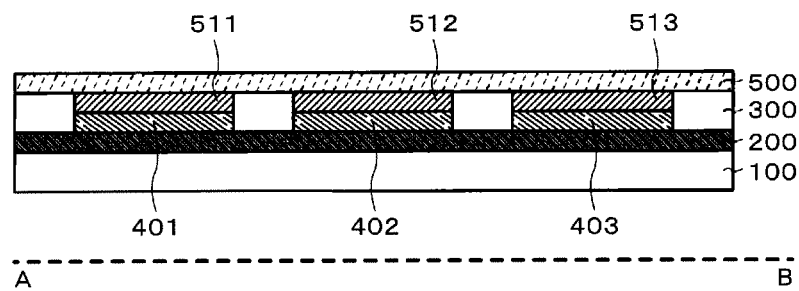

Next, the second electrode 500 is formed over the island-shaped electrodes 511 to 519 and over the nonconductive layer 300. (FIGS. 15A and 15B)

Then, the second substrate is placed on the second electrode 500 side so as to face the first substrate, and sealing is performed using the sealant.

Note that before the sealing is performed, the protective film covering the second electrode 500 is preferably provided.

In this embodiment as well, a short circuit between the first and second electrodes can be prevented.

Since the island-shaped electroluminescence layers are formed on the flat surface of the first electrode, breakages of the island-shaped electroluminescence layers can be prevented.

Furthermore, since the nonconductive layer 300 fills the spaces, breakages of the second electrode can be prevented.

When the nonconductive layer is formed so as to fill the spaces, the plurality of island-shaped electrodes can serve as a barrier and prevent upper portions of the plurality of island-shaped electroluminescence layers from being etched.

By having resistivity lower than the resistivity of the second electrode, the island-shaped electrode can be made to function as an auxiliary electrode. (an auxiliary electrode (1))

Alternatively, by having resistivity lower than the resistivity of the island-shaped electrode, the second electrode can be made to function as an auxiliary electrode. (an auxiliary electrode (2))

Comparison of the auxiliary electrode (1) with the auxiliary electrode (2) shows that the auxiliary electrode (2) is preferable to the auxiliary electrode (1). This is because, due to the fact that the area of the second electrode is larger than the sum of the areas of the plurality of island-shaped electrodes, the auxiliary electrode (2) enables a larger reduction in the resistance value of an upper electrode (a stack of the island-shaped electrode and the second electrode) than the auxiliary electrode (1) does.

Note that when a main purpose is to make the island-shaped electrode or the second electrode function as the auxiliary electrode, the end portions (edge portions) of the island-shaped electrodes may be covered with the nonconductive layer.

This embodiment can be combined with any other embodiment.

Embodiment 7

Figure 16:
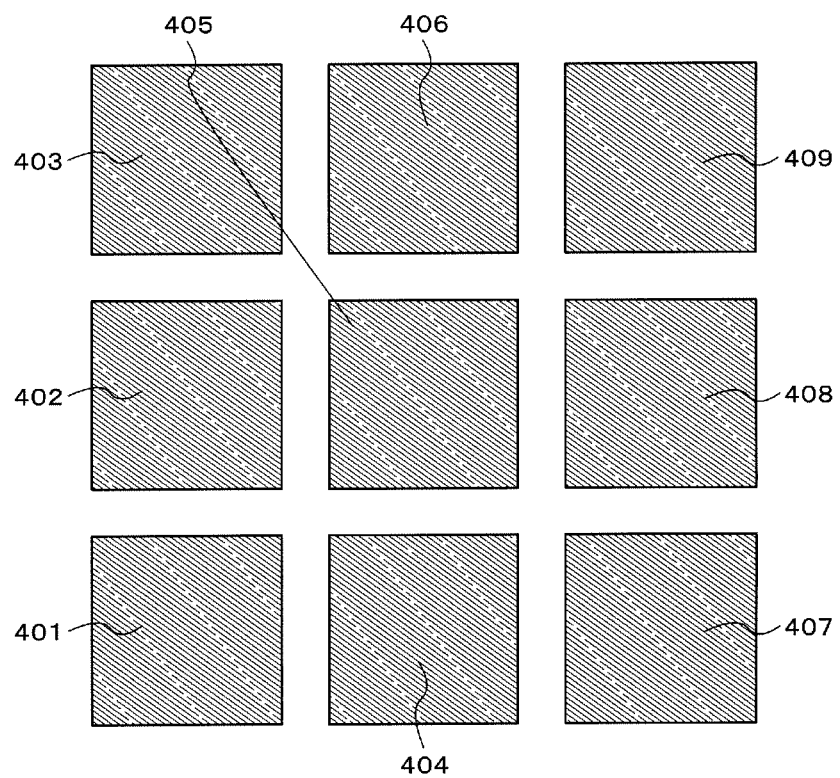
FIG. 16 illustrates an example of a light source.

The island-shaped electroluminescence layers 401 to 409 can take a variety of shapes such as a triangle, a polygon, a circle, an oval, a doughnut, a star, or a heart as well as a quadrilateral illustrated in FIG. 16.

Taking the shape such as a doughnut, a star, or a heart provides a fashionable and attractive appearance, and thus the light source is aesthetically pleasing.

All the island-shaped electroluminescence layers do not necessarily take the same shape.

Even when the plurality of island-shaped electroluminescence layers take different shapes, the light source appeals to a sense of beauty and is aesthetically pleasing.

Alternatively, in order to appeal to a sense of beauty, the plurality of island-shaped electroluminescence layers may exhibit different colors.

As described above, modifying the shape or color of the island-shaped electroluminescence layers can provide a light source that appeals to a sense of beauty.

This embodiment can be combined with any other embodiment.

Embodiment 8

A structure of power supply in the light source is described.

Figure 17A:
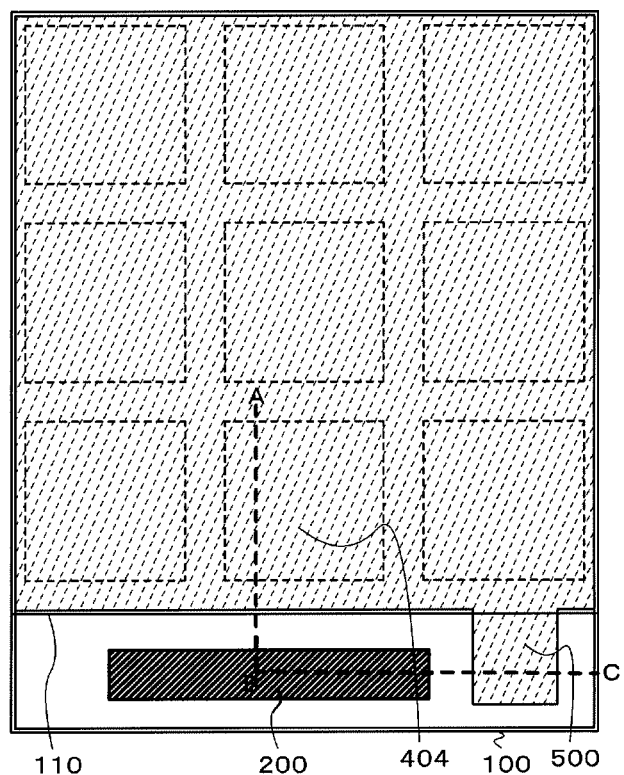
FIGS. 17A and 17B illustrate an example of a light source.
Figure 17B:
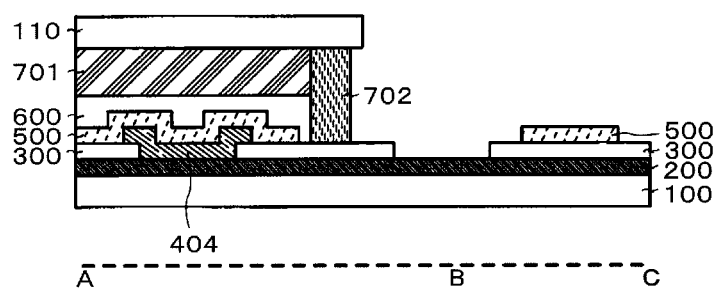

FIGS. 17A and 17B illustrate an example of the structure of the power supply.

The dashed line A-B-C of FIG. 17A corresponds to the dashed line A-B-C of FIG. 17B.

In a light-emitting region where the island-shaped electroluminescence layer is formed, a first sealant 701 fills a region surrounded by the second substrate 110 and a second sealant 702 disposed in the periphery of the light-emitting region.

Note that a protective film 600 is also provided.

In a connection portion, an opening portion is provided in part of the nonconductive layer 300, and the first electrode 200 is exposed in the opening portion.

Further, the second electrode 500 is provided to extend to the connection portion.

Thus, the first and second electrodes are exposed in the connection portion, whereby the power supply can be realized.

This embodiment can be combined with any other embodiment.

Embodiment 9

A structure of the power supply in the light source is described.

FIGS. 18A and 18B and FIGS. 19A and 19B illustrate examples of the structure of the power supply.

Figure 18A:
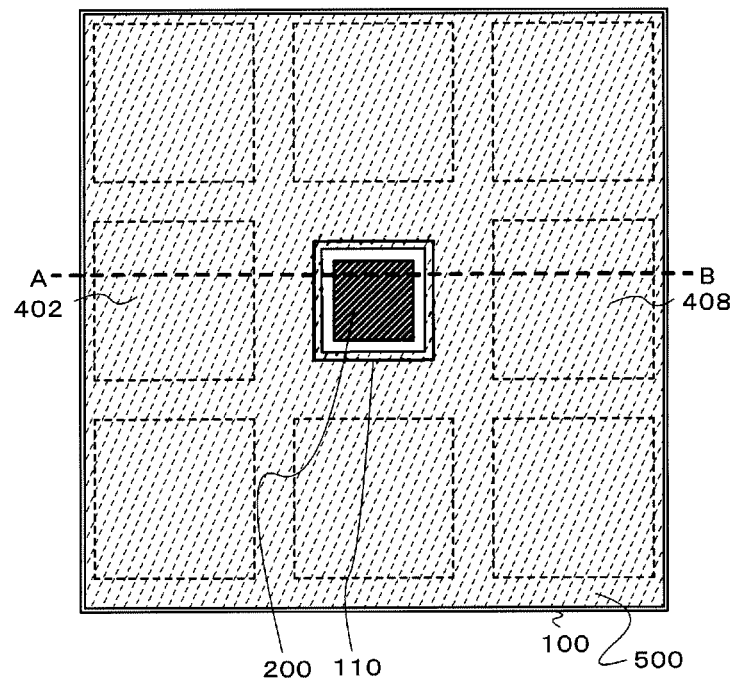
FIGS. 18A and 18B illustrate an example of a light source.
Figure 18B:
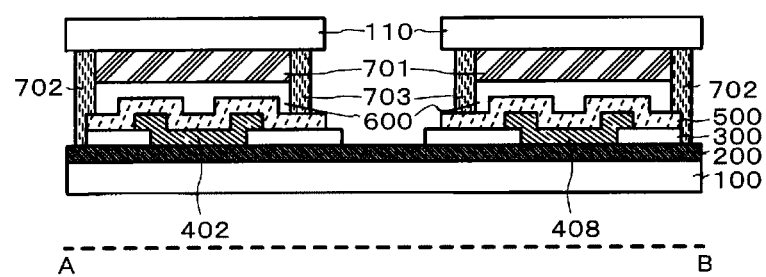

The dashed line A-B-C of FIG. 18A corresponds to the dashed line A-B-C of FIG. 18B.

Figure 19A:
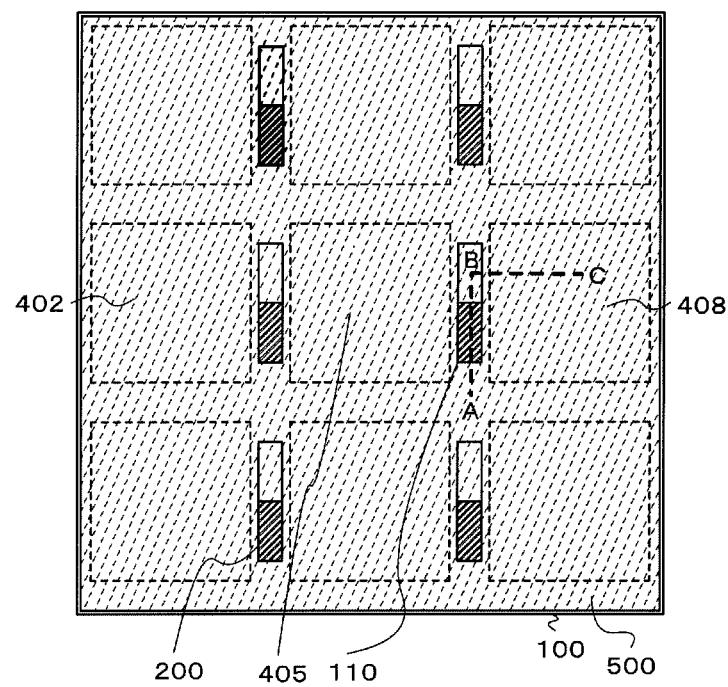
FIGS. 19A and 19B illustrate an example of a light source.
Figure 19B:
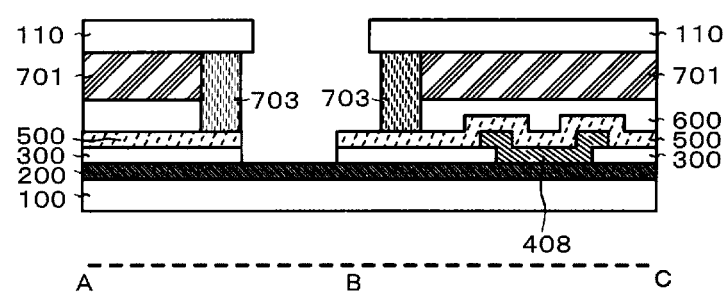

The dashed line A-B-C of FIG. 19A corresponds to the dashed line A-B-C of FIG. 19B.

In FIGS. 18A and 18B, the connection portion is disposed so as to be surrounded by the light-emitting regions.

Thus, an opening portion is provided in the second substrate 110 in FIGS. 18A and 18B.

In the connection portion, the first and second electrodes are exposed.

In FIGS. 19A and 19B, each of the plurality of connection portions is disposed so as to be surrounded by the light-emitting regions.

Thus, the plurality of opening portions are provided in the second substrate 110 in FIGS. 19A and 19B.

In the light-emitting region where the island-shaped electroluminescence layer is formed, the first sealant 701 fills a region surrounded by the second substrate 110 and the second sealant 702 disposed in the periphery of the light-emitting region in FIGS. 18A and 18B, while the first sealant 701 fills a region surrounded by the second substrate 110 and a third sealant 703 disposed in the periphery of the light-emitting region in FIGS. 19A and 19B.

Note that the protective film 600 is also provided.

The arrangement in which the connection portion is surrounded by the light-emitting regions allows a reduction in the area of the first substrate 100.

Providing the connection portions between the island-shaped electroluminescence layers as in FIGS. 19A and 19B realizes an increase in the area of the light-emitting region.

This embodiment can be combined with any other embodiment.

Embodiment 10

As illustrated in FIG. 20, FIGS. 21A and 21B, FIG. 22, and FIGS. 23A and 23B, the island-shaped electroluminescence layers may have the shape of a ring (e.g., a circular ring or a polygonal ring).

Figure 20:
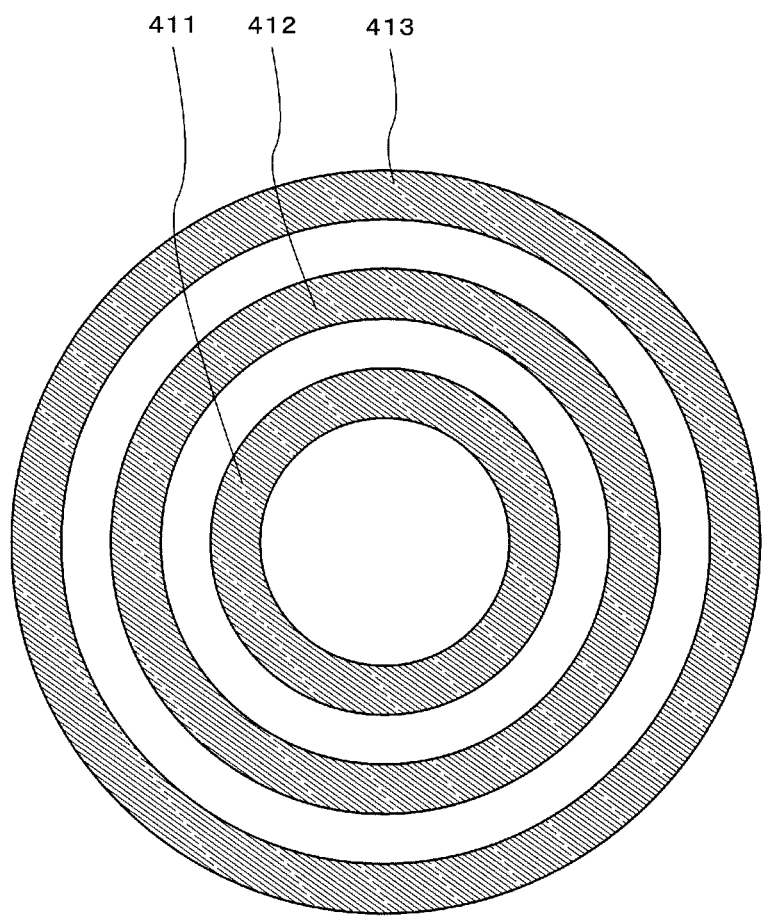
FIG. 20 illustrates an example of a light source.

FIG. 20 illustrates the island-shaped electroluminescence layers 411 to 413 having the shape of a circular ring.

Figure 21A:
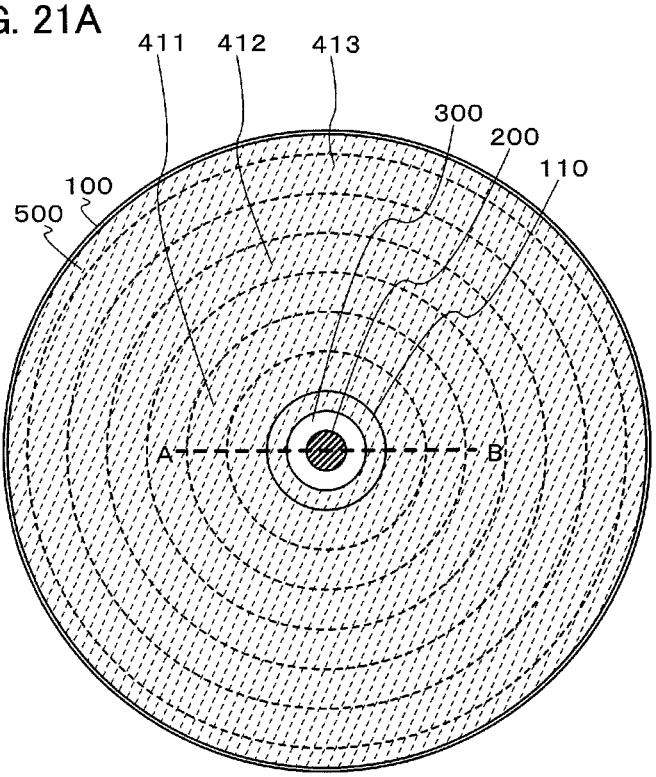
FIGS. 21A and 21B illustrate an example of a light source.
Figure 21B:
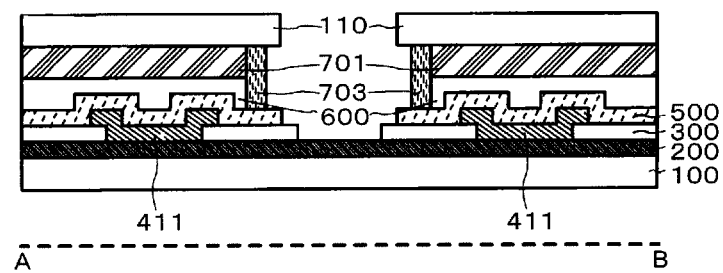

FIGS. 21A and 21B illustrate a structure of the connection portion of the island-shaped electroluminescence layers 411 to 413 having the shape of a circular ring.

Note that the dashed line A-B of FIG. 21A corresponds to the dashed line A-B of FIG. 21B.

Figure 22:
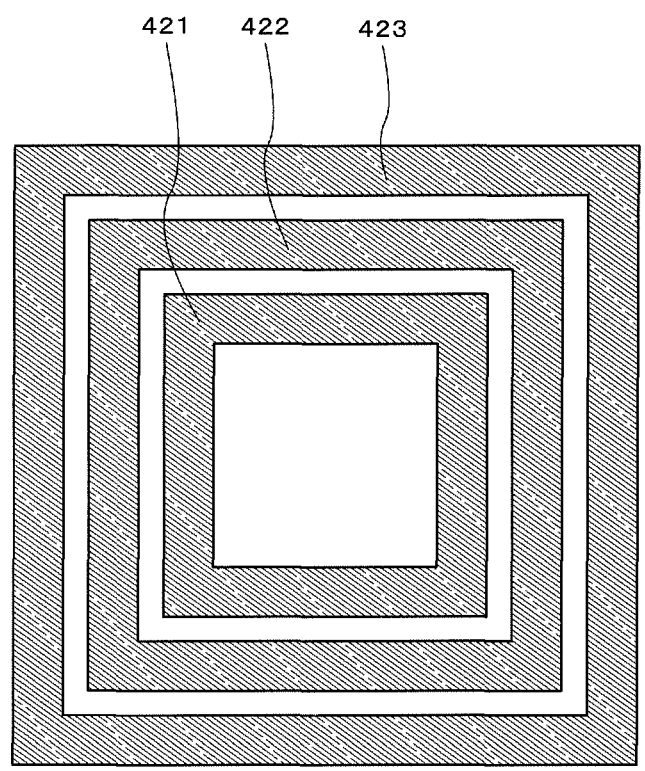
FIG. 22 illustrates an example of a light source.

FIG. 22 illustrates the island-shaped electroluminescence layers 421 to 423 having the shape of a polygonal ring.

Figure 23A:
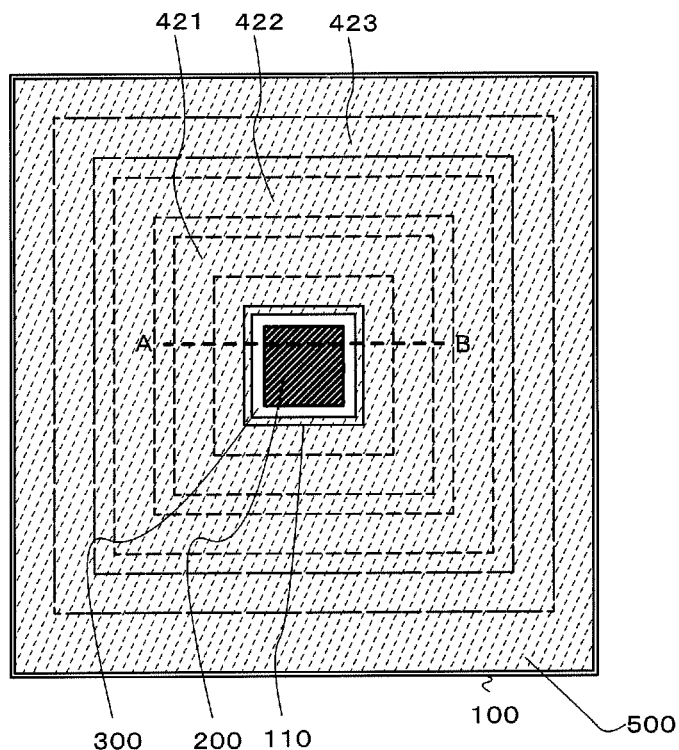
FIGS. 23A and 23B illustrate an example of a light source.
Figure 23B:
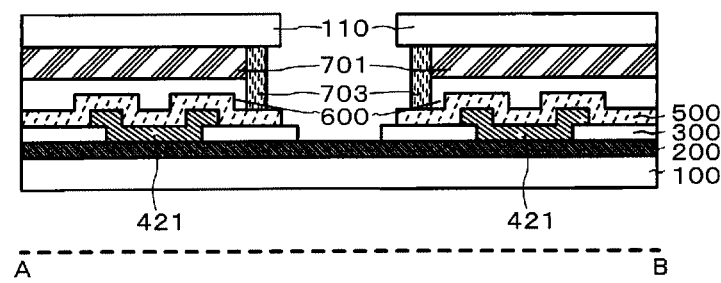

FIGS. 23A and 23B illustrate a structure of the connection portion of the island-shaped electroluminescence layers 421 to 423 having the shape of a polygonal ring.

Note that the dashed line A-B of FIG. 23A corresponds to the dashed line A-B of FIG. 23B.

Thus, the connection portion is preferably provided at the center of the plurality of rings, because the light-emitting region and the connection portion can increase in area in this case.

This embodiment can be combined with any other embodiment.

Embodiment 11

Providing the plurality of island-shaped electroluminescence layers allows the light source to be shaped as desired.

Because the electroluminescence layer has been formed over the entire surface in a conventional light source, cutting the light source results in exposure of a side surface of the electroluminescence layer.

The exposure of the side surface of the electroluminescence layer causes deterioration of the whole electroluminescence layer, making it impossible to function as a light source.

This problem can be solved by the formation of the plurality of island-shaped electroluminescence layers.

Figure 32A:
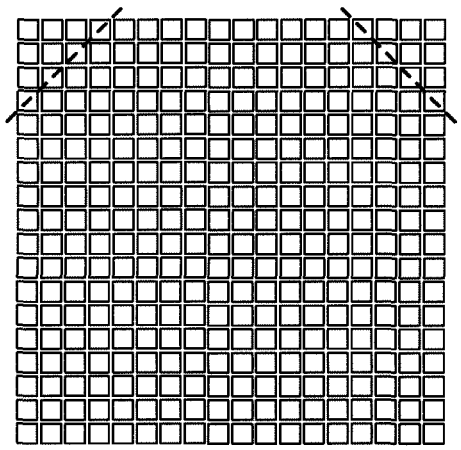
FIGS. 32A and 32B show cutting of a light source.

FIG. 32A is the light source before a cutting process.

Figure 32B:
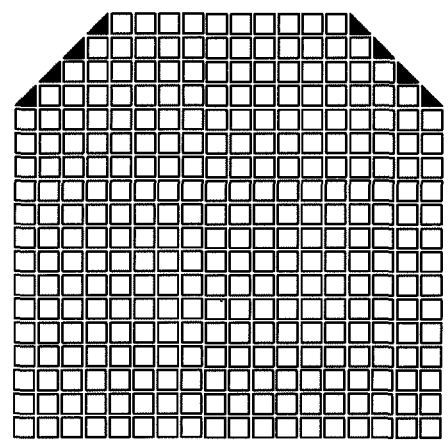
Figure 33:
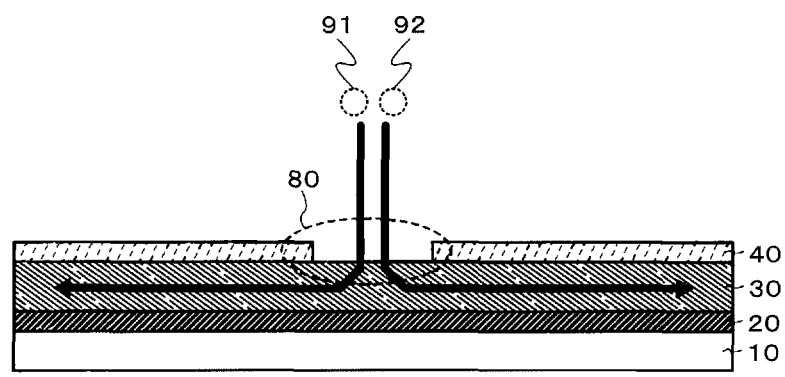
FIG. 33 illustrates an example of a conventional technique.

FIG. 32B is the light source after the cutting process.

In FIGS. 32A and 32B, white island-shaped portions represent the island-shaped electroluminescence layers having unexposed side surfaces, black island-shaped portions the island-shaped electroluminescence layers having exposed side surfaces, and the dashed lines cut portions.

As apparent from FIGS. 32A and 32B, the island-shaped electroluminescence layers formed at the cut portions stop exhibiting light emission because of the exposure of the side surfaces, while the island-shaped electroluminescence layers formed at a portion other than the cut portions continue exhibiting light emission because the side surfaces are not exposed.

In this manner, it is possible to provide the light source capable of being shaped as desired.

When the first substrate or the second substrate is a rigid substrate such as a glass substrate or a quartz substrate, laser cutting, a dicing apparatus, or the like may preferably be used in the cutting process.

In contrast, when the substrate itself is soft as in a flexible light source, the cutting process can be easily carried out with a simple cutting tool, such as scissors or a cutter; thus, anyone can enjoy shaping the light source at school, home, etc.

When the cutting process is carried out, an inorganic insulating layer or a semiconductor layer is preferably used as the nonconductive layer for prevention of moisture penetration.

The cutting process is preferably carried out so that the connection portion remains after the cutting process.

When the connection portion is surrounded by the light-emitting regions as in FIGS. 18A and 18B, there is no limitation on the resulting shape after the cutting process because the cutting process is carried out so that the connection portion remains.

Further, the structure in which the plurality of connection portions as in FIGS. 19A and 19B is very preferable because this structure eliminates the need for attention to the positions of the connection portions during the cutting process.

If only one connection portion is provided, a cut piece in which no connection portion remains goes to waste. In contrast, when the plurality of connection portions are provided, even the cut piece can exhibit light emission and be used again as a light source.

By providing cutting holes forming a dashed line (perforations) as illustrated in FIG. 24 to FIG. 28, the cutting process does not require use of a cutting tool and can be easily carried out at school etc.

It is preferable that the cutting holes forming a dashed line (perforations) be precisely formed by using laser cutting or the like.

The cutting holes forming a dashed line (perforations) are formed so as to be pierced through the first substrate, the second substrate, the sealant, the first electrode, the second electrode, the nonconductive layer, the protective film, and the like.

Figure 24:
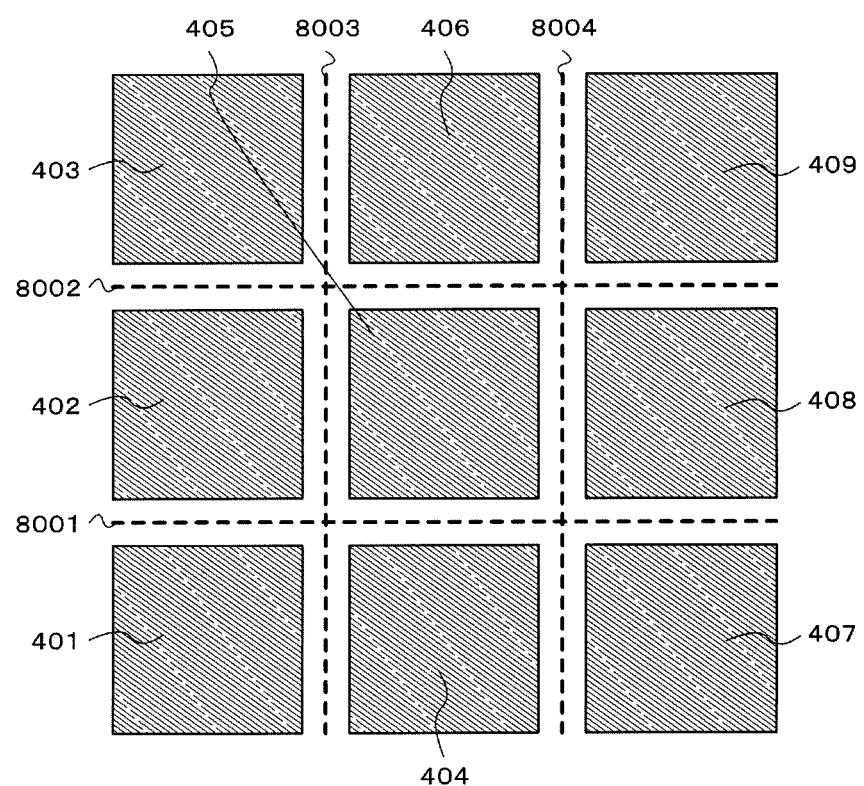
FIG. 24 illustrates an example of a light source.

In FIG. 24, dashed lines 8001 to 8004 are the cutting holes forming dashed lines (perforations) and formed at places where no island-shaped electroluminescence layer and no connection portion are formed. Preferably, one connection portion is provided for one island-shaped electroluminescence layer.

Figure 25:
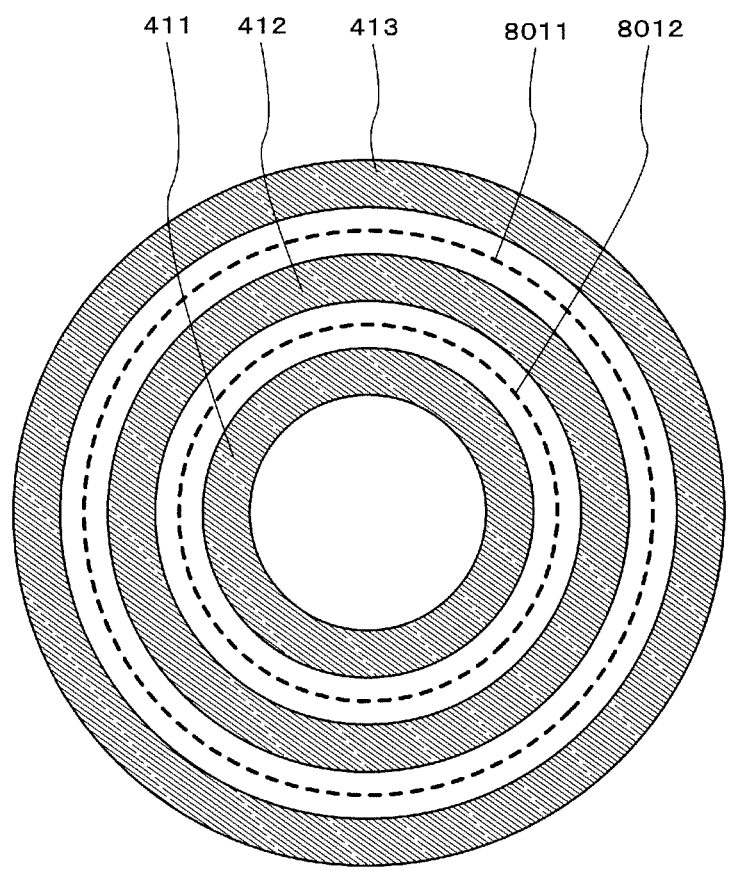
FIG. 25 illustrates an example of a light source.

In FIG. 25, dashed lines 8011 and 8012 are the cutting holes forming dashed lines (perforations) and formed at places where no island-shaped electroluminescence layer and no connection portion are formed. Such cutting holes forming dashed lines (perforations) between the rings allow adjustment for a desired size afterward.

Figure 26:
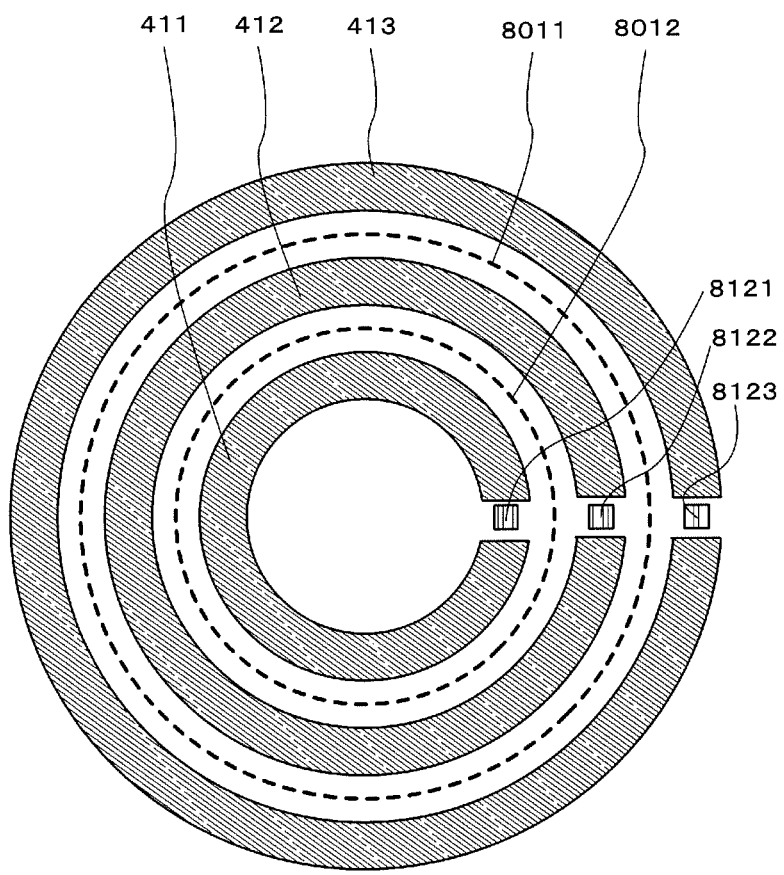
FIG. 26 illustrates an example of a light source.

FIG. 26 illustrates an example obtained by varying the structure of FIG. 25, in which part of the rings is notched and connection portions 8121 to 8123 are provided at notched portions. In the structure of FIG. 26, all the circular rings can exhibit light emission even after the cutting process.

Figure 27:
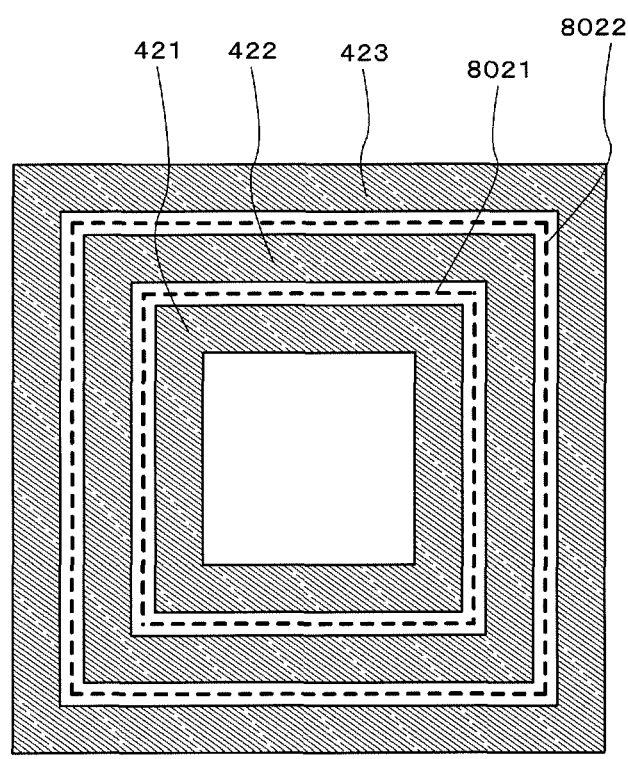
FIG. 27 illustrates an example of a light source.

In FIG. 27, the dashed lines 8021 to 8022 are the cutting holes forming dashed lines (perforations) and formed at places where no island-shaped electroluminescence layer and no connection portion are formed. Such cutting holes forming dashed lines (perforations) between the polygonal rings allow adjustment for a desired size afterward.

Figure 28:
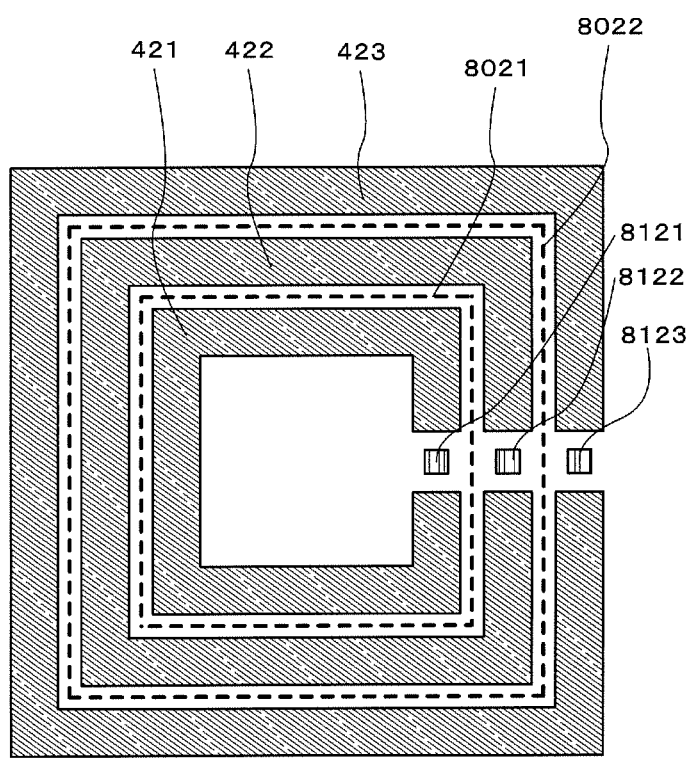
FIG. 28 illustrates an example of a light source.

FIG. 28 illustrates an example obtained by varying the structure of FIG. 27, in which part of the rings is notched and the connection portions 8121 to 8123 are provided at notched portions. In the structure of 7 FIG. 28, all the polygonal rings can exhibit light emission even after the cutting process.

Since the cutting holes forming a dashed line (perforations) are formed at places where no island-shaped electroluminescence layer and no connection portion are formed, the side surfaces of the island-shaped electroluminescence layers are not exposed both before and after the cutting process, whereby deterioration of the light source can be prevented.

This embodiment can be combined with any other embodiment.

Embodiment 12

Figure 29:
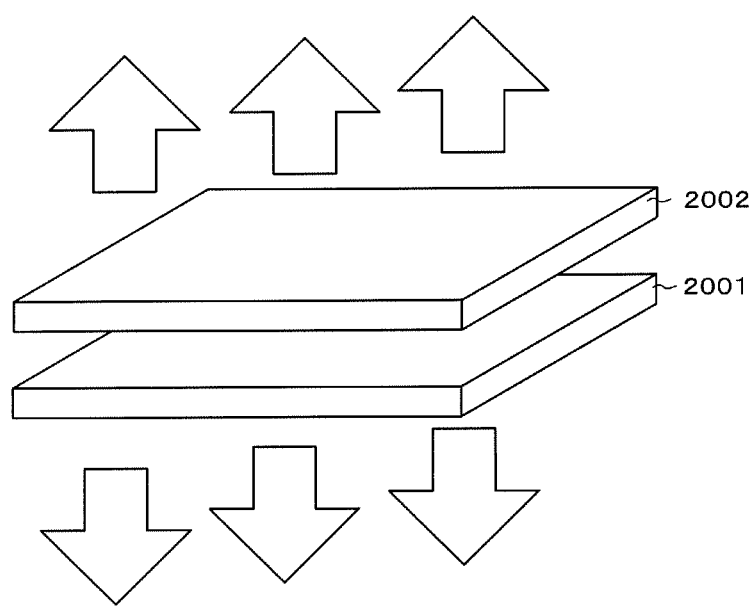
FIG. 29 illustrates an example of a light source.

FIG. 29 illustrates a device in which a light guide plate 2002 is disposed to face a dual-emission light source 2001.

Since the electroluminescence layers are divided into island-shaped layers, the dual-emission light source 2001 does not exhibit uniform light emission.

Therefore, uniform light emission is obtained by providing the light guide plate 2002.

In addition, non-uniform light emission is also exhibited from a side where the light guide plate 2002 is not disposed.

Thus, by arranging the island-shaped electroluminescence layers so as to form a mark, it is possible to provide a practical and fashionable device (or a light-emitting panel) in which uniform light emission is exhibited from one side while the illuminated mark is exhibited from the other side. When the purpose is to obtain uniform light emission, the light source may be of a one-side emission type. In the one-side emission type, the light guide plate is provided on a side of the one-side emission light source where light is emitted.

Figure 30:
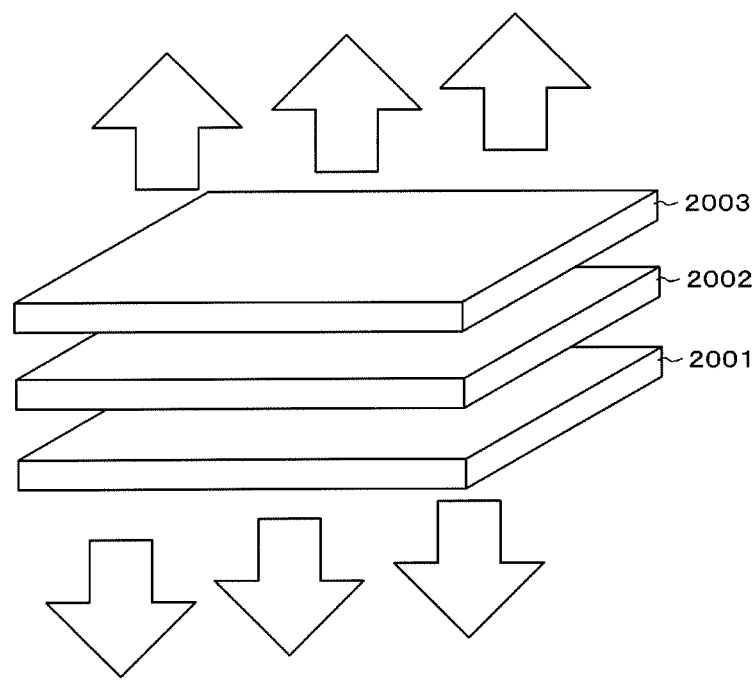
FIG. 30 illustrates an example of a display device having a light source.

With the structure in which the light guide plate 2002 is interposed between the dual-emission light source 2001 and a display panel 2003 as illustrated in FIG. 30, it is possible to provide a device (or a display device) in which display can be enjoyed on one side while the mark is illuminated on the other side, for instance. When the purpose is to obtain uniform light emission, the light source may be of a one-side emission type. In the one-side emission type, the light guide plate is provided on a side of the one-side emission light source where light is emitted.

Examples of the display panel include, but not limited to, a liquid crystal display panel, an electrophoretic display panel using a microcapsule, an organic electroluminescence display panel, an inorganic electroluminescence display panel, and the like.

The liquid crystal display panel, the electrophoretic display, and the like are display panels using an optical modulation system.

The organic electroluminescence display panel, the inorganic electroluminescence display panel, and the like are self-luminous display panels.

By providing the self-luminous display panel with a backlight, brightness can be enhanced.

The enhancement of brightness is needed when, for example, display appears dark because of deterioration of the self-luminous display panel, or appears dim at a bright place.

When the self-luminous display panel is provided with the backlight, a pair of electrodes included in a light-emitting element of the display panel preferably has a light-transmitting property so that light can be transmitted through the light-emitting region of the self-luminous display panel.

The mark refers to, for instance, a tile pattern (e.g., FIG. 16), a plurality of rings (e.g., FIG. 20, FIG. 22, and FIG. 25 to FIG. 28), a symbol, a letter, a number, a geometrical pattern, etc., without limitation.

In order that more uniform light emission can be obtained from one side, it is preferable to use the structures such as the tile pattern (e.g., FIG. 16) and the plurality of rings (e.g., FIG. 20, FIG. 22, and FIG. 25 to FIG. 28) in which the island-shaped electroluminescence layers are densely arranged.

In FIG. 29 and FIG. 30, the nonconductive layer is preferably made to have a light-shielding property (e.g., black resin or a stack structure including a metal layer) because the background can be kept out of sight in this case.

Especially in FIG. 30, since the external light could render the display visible on the side where the mark is illuminated, making the nonconductive layer have a light-shielding property is effective.

As the light guide plate, a diffusing agent may be mixed into a resin plate (e.g., an acrylic plate) to diffuse light, or a resin plate (e.g., an acrylic plate) may be subjected to surface processing to diffuse light, for instance, although the present invention is not limited to these examples. Note that the light guide plate may be a film sheet. Note also that the light guide plate 2002 is not an essential element and is provided as needed.

This embodiment can be combined with any other embodiment.

Embodiment 13

The plurality of island-shaped electroluminescence layers may exhibit a plurality of emission colors. (e.g., a light source having an island-shaped electroluminescence layer for red, an island-shaped electroluminescence layer for blue, and an island-shaped electroluminescence layer for green)

The island-shaped electroluminescence layer may have a structure in which a plurality of light-emitting layers for different emission colors are stacked. (e.g., the island-shaped electroluminescence layer having a light-emitting layer for red, a light-emitting layer for blue, and a light-emitting layer for green)

The plurality of island-shaped electroluminescence layers may exhibit a plurality of emission colors, and may have a stack structure in which the plurality of light-emitting layers for different emission colors are provided.

Exhibiting different emission colors in this manner is preferable because a variety of colors, marks, and the like can be expressed in this case.

This embodiment can be combined with any other embodiment.

This application is based on Japanese Patent Application serial No. 2009-149726 filed with Japan Patent Office on Jun. 24, 2009, the entire contents of which are hereby incorporated by reference.

What is claimed is:

1. A light source comprising:
a first electrode;
a nonconductive layer over the first electrode, the nonconductive layer comprising a plurality of opening portions;
a plurality of island-shaped light-emitting layers comprising a first island-shaped light-emitting layer and a second island-shaped light-emitting layer; and
a second electrode covering the plurality of island-shaped light-emitting layers,
wherein a center portion of the first island-shaped light-emitting layer is formed in one of the plurality of opening portions, and wherein an end portion of the first island-shaped light-emitting layer is formed outside the one of the plurality of opening portions over the nonconductive layer.

2. The light source according to claim 1,
wherein a sidewall of the plurality of opening portions has a tapered shape.

3. The light source according to claim 1,
wherein cutting holes forming a dashed line are provided between the first island-shaped light-emitting layer and the second island-shaped light-emitting layer.

4. A device comprising:
the light source according to claim 1; and
a light guide plate provided to face the light source.

5. The device according to claim 4,
wherein the light source is a dual-emission light source.

6. A device comprising:
the light source according to claim 1;
a display panel; and
a light guide plate between the light source and the display panel.

7. The device according to claim 6,
wherein the light source is a dual-emission light source.

8. The light source according to claim 1,
wherein the first island-shaped light-emitting layer is interposed between the first electrode and the second electrode.

9. A light source comprising:
a first electrode;
a nonconductive layer comprising a plurality of opening portions and being formed by making the first electrode have an insulating surface;
a plurality of island-shaped light-emitting layers comprising a first island-shaped light-emitting layer and a second island-shaped light-emitting layer; and
a second electrode covering the plurality of island-shaped light-emitting layers,
wherein a center portion of the first island-shaped light-emitting layer is formed in one of the plurality of opening portions, and
wherein an end portion of the first island-shaped light-emitting layer is formed outside the one of the plurality of opening portions over the nonconductive layer.

10. The light source according to claim 9,
wherein a sidewall of the plurality of opening portions has a tapered shape.

11. The light source according to claim 9,
wherein cutting holes forming a dashed line are provided between the first island-shaped light-emitting layer and the second island-shaped light-emitting layer.

12. A device comprising:
the light source according to claim 9; and
a light guide plate provided to face the light source.

13. The device according to claim 12,
wherein the light source is a dual-emission light source.

14. A device comprising:
the light source according to claim 9;
a display panel; and
a light guide plate between the light source and the display panel.

15. The device according to claim 14,
wherein the light source is a dual-emission light source.

16. The light source according to claim 9,
wherein the first island-shaped light-emitting layer is interposed between the first electrode and the second electrode.

17. A light source comprising:
a first electrode;
a plurality of island-shaped light-emitting layers comprising a first island-shaped light-emitting layer and a second island-shaped light-emitting layer over the first electrode;
a nonconductive layer comprising a plurality of opening portions over the first electrode; and
a second electrode over the nonconductive layer,
wherein the second electrode is in contact with the first island-shaped light-emitting layer exposed in one of the plurality of opening portions, and
wherein the nonconductive layer is formed to cover an end portion of the first island-shaped light-emitting layer outside the one of the plurality of opening portions.

18. The light source according to claim 17,
wherein a sidewall of the plurality of opening portions has a tapered shape.

19. The light source according to claim 17,
wherein cutting holes forming a dashed line are provided between the first island-shaped light-emitting layer and the second island-shaped light-emitting layer.

20. A device comprising:
the light source according to claim 17; and
a light guide plate provided to face the light source.

21. The device according to claim 20,
wherein the light source is a dual-emission light source.

22. A device comprising:
the light source according to claim 17;
a display panel; and
a light guide plate between the light source and the display panel.

23. The device according to claim 22,
wherein the light source is a dual-emission light source.

24. The light source according to claim 17,
wherein the first island-shaped light-emitting layer is interposed between the first electrode and the second electrode.

* * * * *